United States Patent
Sohn et al.

(10) Patent No.: US 10,243,000 B2
(45) Date of Patent: Mar. 26, 2019

(54) 3-DIMENSIONAL NON-VOLATILE MEMORY DEVICE AND METHOD OF FABRICATING THE SAME

(71) Applicant: UNIVERSITY-INDUSTRY FOUNDATION (UIF), YONSEI UNIVERSITY, Seoul (KR)

(72) Inventors: Hyun Chul Sohn, Seoul (KR); Hee Do Na, Seoul (KR); Young Mo Kim, Seoul (KR)

(73) Assignee: UNIVERSITY-INDUSTRY FOUNDATION (UIF), YONSEI UNIVERSITY, Seoul (KR)

( * ) Notice: Subject to any disclaimer, the term of this patent is extended or adjusted under 35 U.S.C. 154(b) by 0 days.

(21) Appl. No.: 15/598,539

(22) Filed: May 18, 2017

(65) Prior Publication Data
US 2017/0338243 A1 Nov. 23, 2017

(30) Foreign Application Priority Data
May 19, 2016 (KR) .......................... 10-2016-0061462

(51) Int. Cl.
*H01L 21/28* (2006.01)
*H01L 27/11582* (2017.01)
(Continued)

(52) U.S. Cl.
CPC .. *H01L 27/11582* (2013.01); *H01L 21/28282* (2013.01); *H01L 27/1157* (2013.01); *H01L 27/11524* (2013.01); *H01L 27/11556* (2013.01)

(58) Field of Classification Search
CPC ............................................. H01L 27/11582
See application file for complete search history.

(56) References Cited

U.S. PATENT DOCUMENTS 7,906,818 B2 * 3/2011 Pekny ............... H01L 27/11568
257/390
8,674,426 B2 * 3/2014 Higuchi ............ H01L 27/11578
257/316

(Continued)

FOREIGN PATENT DOCUMENTS

KR 10-2010-0074543 7/2010

OTHER PUBLICATIONS

Office Action dated May 31, 2018 corresponding to Korean Application No. 10-2016-0061462, 7 pages.

*Primary Examiner* — Eugene Lee

(57) ABSTRACT

Provided are a 3-dimensional non-volatile memory device and a method of fabricating the same. The 3-dimensional non-volatile memory device may include a substrate; semiconductor pillars, which are arranged at a certain interval in a first direction and a second direction different from the first direction; a string isolation film, which is arranged between the semiconductor pillars arranged in the first direction among the semiconductor pillars and extends in the first direction and a third direction vertical to the main surface of the substrate; first sub-electrodes repeatedly stacked on the substrate in the third direction; second sub-electrodes, which are electrically isolated from the first sub-electrodes by the string isolation film, and are repeatedly stacked on the substrate in the third direction; and information storage films including a first information storage film and a second information storage film.

17 Claims, 26 Drawing Sheets

(51) Int. Cl.
*H01L 27/11524* (2017.01)
*H01L 27/11556* (2017.01)
*H01L 27/1157* (2017.01)

(56) References Cited

U.S. PATENT DOCUMENTS

| | | | |
|---|---|---|---|
| 9,105,736 B2 * | 8/2015 | Son | H01L 27/11551 |
| 9,520,485 B2 * | 12/2016 | Lue | H01L 21/28282 |
| 2008/0073635 A1 * | 3/2008 | Kiyotoshi | H01L 27/105 |
| | | | 257/2 |
| 2012/0081958 A1 * | 4/2012 | Lee | G11C 16/0483 |
| | | | 365/185.05 |
| 2012/0326223 A1 * | 12/2012 | Omura | H01L 27/11565 |
| | | | 257/324 |
| 2013/0214344 A1 * | 8/2013 | Lim | H01L 29/792 |
| | | | 257/324 |
| 2015/0194435 A1 * | 7/2015 | Lee | H01L 27/11575 |
| | | | 257/329 |
| 2015/0340371 A1 * | 11/2015 | Lue | H01L 21/28282 |
| | | | 257/324 |
| 2016/0071861 A1 | 3/2016 | Serov et al. | |
| 2016/0086972 A1 * | 3/2016 | Zhang | H01L 27/11582 |
| | | | 257/66 |
| 2016/0260725 A1 * | 9/2016 | Jung | H01L 27/11565 |
| 2017/0236836 A1 * | 8/2017 | Huo | H01L 27/11582 |
| | | | 257/324 |

* cited by examiner

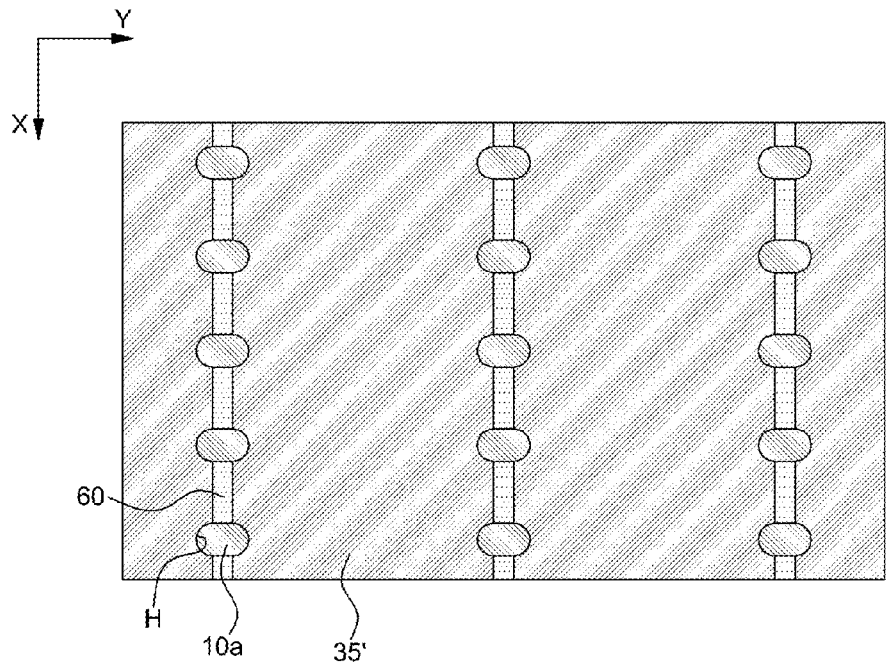
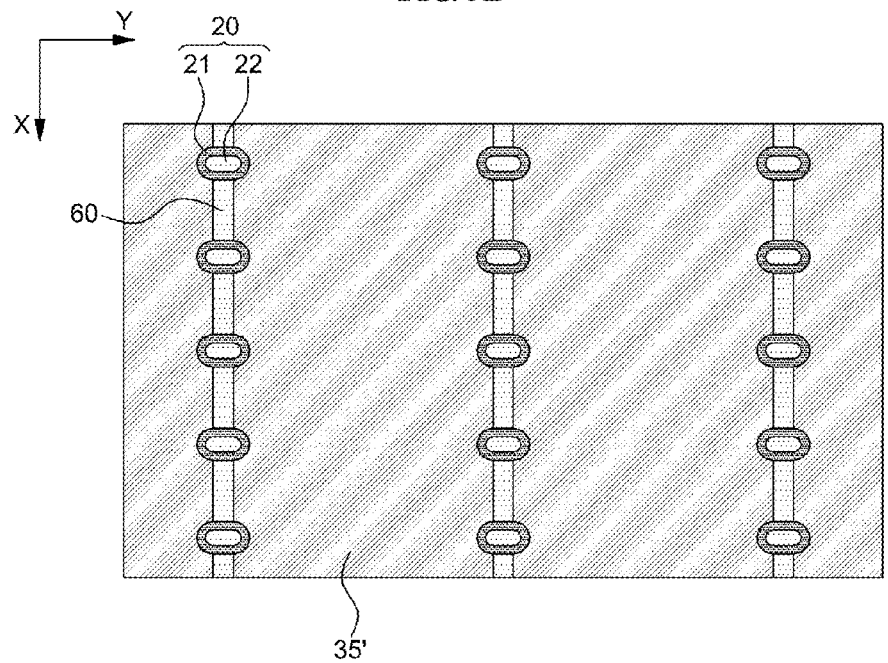

3-DIMENSIONAL NON-VOLATILE MEMORY DEVICE AND METHOD OF FABRICATING THE SAME

CROSS-REFERENCE TO RELATED APPLICATION

This application claims priority of Korean Patent Application No. 10-2016-0061462, filed on May 19, 2016, in the KIPO (Korean Intellectual Property Office), the disclosure of which is incorporated herein entirely by reference.

BACKGROUND OF THE INVENTION

Field of the Invention

The present disclosure relates to a semiconductor technique, and more particularly, to a 3-dimensional non-volatile memory device and a method of fabricating the same.

Description of the Related Art

Due to increasing demands for portable application devices, such as digital cameras, smart phones, and tablet PCs, and replacement of conventional hard disk drives with solid-state drives (SSDs), markets for non-volatile memory devices are rapidly growing. Among the non-volatile memory devices, NAND flash memory devices are popular due to low manufacturing cost for high degree of integration.

Recently, downscaling the NAND flash memory device with a conventional two-dimensional (2D) memory cell array architecture has become more difficult as 20 nm or smaller photolithography techniques have reached their limits. In addition, design issues, which are related to reduction of a sensing margin in accordance with reduction of a number of electrons stored in a data storage film (e.g., a floating gate), and related to disturbances between memory cells, have become barriers against the downscaling of the conventional 2D memory cell array architecture.

To address the issues for downscaling of the NAND flash memory devices, various 3-dimensional NAND flash array structures have been suggested. For example, vertical NAND flash memory cell arrays of Terabit Cell Array Transistor (TCAT) and Bit-Cost Scalable (BiCs) structure are investigated. Even in these 3-dimensional NAND flash array structures, the downscaling of the structures is still required in order to increase data storage capacity. Conventionally, there is an approach to increase the number of gate layers in a conventional structure or to form a single memory cell as a multi-bit memory cell, but the fabricating process therefor becomes more complicated.

SUMMARY OF THE INVENTION

Provided is a 3-dimensional non-volatile memory device capable of increasing data storage capacity based on a simple design modification.

Provided is a method of fabricating a 3-dimensional non-volatile memory device having the above-stated advantage.

Additional aspects will be set forth in part in the description which follows and, in part, will be apparent from the description, or may be learned by practice of the presented embodiments. According to an aspect of an embodiment, a 3-dimensional non-volatile memory device includes a substrate; semiconductor pillars, which are arranged at a certain interval in a first direction and a second direction different from the first direction, and both of the first direction and the second direction are parallel to the main surface of the substrate; a string isolation film, which is arranged between the semiconductor pillars arranged in the first direction among the semiconductor pillars and extends in the first direction and a third direction vertical to the main surface of the substrate; first sub-electrodes repeatedly stacked on the substrate in the third direction; second sub-electrodes, which are electrically isolated from the first sub-electrodes by the string isolation film, and are repeatedly stacked on the substrate in the third direction; and information storage films including a first information storage film and a second information storage film, the first information film being disposed between the first sub-electrodes and the semiconductor pillars arranged in the first direction, and the second information storage film disposed between the second sub-electrodes and the semiconductor pillars being arranged in the first direction. First memory strings may be provided by a first information storage film and the first sub-electrodes, second memory strings may be provided by a second information storage film and the second sub-electrodes. The first memory string and the second memory string may share the semiconductor pillars arranged in the first direction According to an embodiment, the string isolation film may have a flat plate-type structure having a constant thickness. Furthermore, the information storage film may include the first information storage film between the first sub-electrodes and the semiconductor pillars arranged in the first direction and the second information storage film between the second sub-electrodes and the semiconductor pillars arranged in the first direction.

The information storage film may include a tunneling insulation film on the semiconductor pillar, a charge storage layer on the tunneling insulation film, and a blocking insulation film on the charge storage layer. An insulation layer pattern may be inserted between the first sub-electrodes and the second sub-electrode, and the insulation layer pattern and the string isolation film may be formed of a same material. According to another embodiment, an insulation layer pattern may be inserted between the first sub-electrodes and the second sub-electrode, and the insulation layer pattern and the string isolation film may be formed of different materials having etch selectivity.

Contact surfaces of the semiconductor pillar against the first sub-electrode and the second sub-electrode may have circular arc cross-sections. The circular arc cross-sections may have semicircular shapes. According to an embodiment, the centers of the circular arc cross-sections may have a thickness greater than the thickness of the string isolation film.

The semiconductor pillar may include a core insulator extending in the vertical direction and a semiconductor layer formed on the core insulator. The semiconductor layer includes poly-silicon, and thickness of the semiconductor layer may be from about 8 nm to about 12 nm.

The semiconductor pillar may have a straight-shaped bit cost scalable structure (BiCs), a pipe-shaped BiCs structure, or a combination thereof. According to an embodiment, the memory strings may constitute a NAND-type flash memory device.

According to an aspect of another embodiment, a method of fabricating a 3-dimensional non-volatile memory device, the method includes providing a substrate; alternately and repeatedly stacking insulation films and sacrificing films vertically on the substrate; forming a first trench region that extends in a first direction parallel to the substrate and a direction vertical to the substrate by successively patterning the repeatedly stacked insulation films and sacrificing films in the vertical direction; filling the first trench region with a first insulator to be a string isolation film; forming semiconductor pillars passing through the first insulator and penetrating the repeatedly stacked insulation films and sacrificing films in the vertical direction; forming a second trench region that extends in the first direction and the vertical direction by patterning the repeatedly stacked insulation films and sacrificing films to separate the semiconductor pillars aligned in a second direction different from the first direction and forming a stacked structure of insulation film patterns and sacrificing film patterns penetrated by the semiconductor pillars; forming cell spaces by removing the sacrificing film patterns of the stacked structure, wherein the sidewalls of the semiconductor pillars are exposed between the stacked insulation film patterns in the cell spaces; forming information storage films on the exposed sidewalls of the semiconductor pillars in the cell spaces; and forming a conductive film on the information storage films by filling at least some of the cell spaces.

According to an aspect of another embodiment, a method of fabricating a 3-dimensional non-volatile memory device, the method includes providing a substrate; alternately and repeatedly stacking insulation films and sacrificing films on the substrate; forming semiconductor pillars that extend in a vertical direction to successively penetrate through the repeatedly stacked insulation films and sacrificing films, wherein the semiconductor pillars are apart from one another in a first direction and a second direction different from the first direction, and the first direction and the second direction are parallel to the substrate; forming a first trench region that extends in the first direction and the vertical direction to separate the semiconductor pillars arranged in the second direction by patterning the repeatedly stacked insulation films and sacrificing films so that stacked structures of insulation film patterns and sacrificing film patterns are formed; removing a portion of the sacrificing film patterns of the stacked structure exposed through the first trench region to leave other portion of the sacrificing film patterns between the semiconductor pillars arranged in the first direction so as to form cell spaces between the stacked insulation film patterns, wherein the sidewalls of the semiconductor pillars are exposed in the cell spaces; forming information storage films on the exposed sidewalls of the semiconductor pillars in the exposed cell spaces; and forming a conductive film on the information storage films by filling at least some of the cell spaces. According to an embodiment, contact surfaces of the semiconductor pillar against the conductive film may have circular arc cross-sections.

BRIEF DESCRIPTION OF THE DRAWINGS

The above and other features and advantages will become more apparent to those of ordinary skill in the art by describing in detail exemplary embodiments with reference to the attached drawings, in which:

FIGS. 5A through 5L are plan views corresponding to the cross-sectional views of FIGS. 4A through 4L, respectively;

In the following description, the same or similar elements are labeled with the same or similar reference numbers.

DETAILED DESCRIPTION

Figure 1:
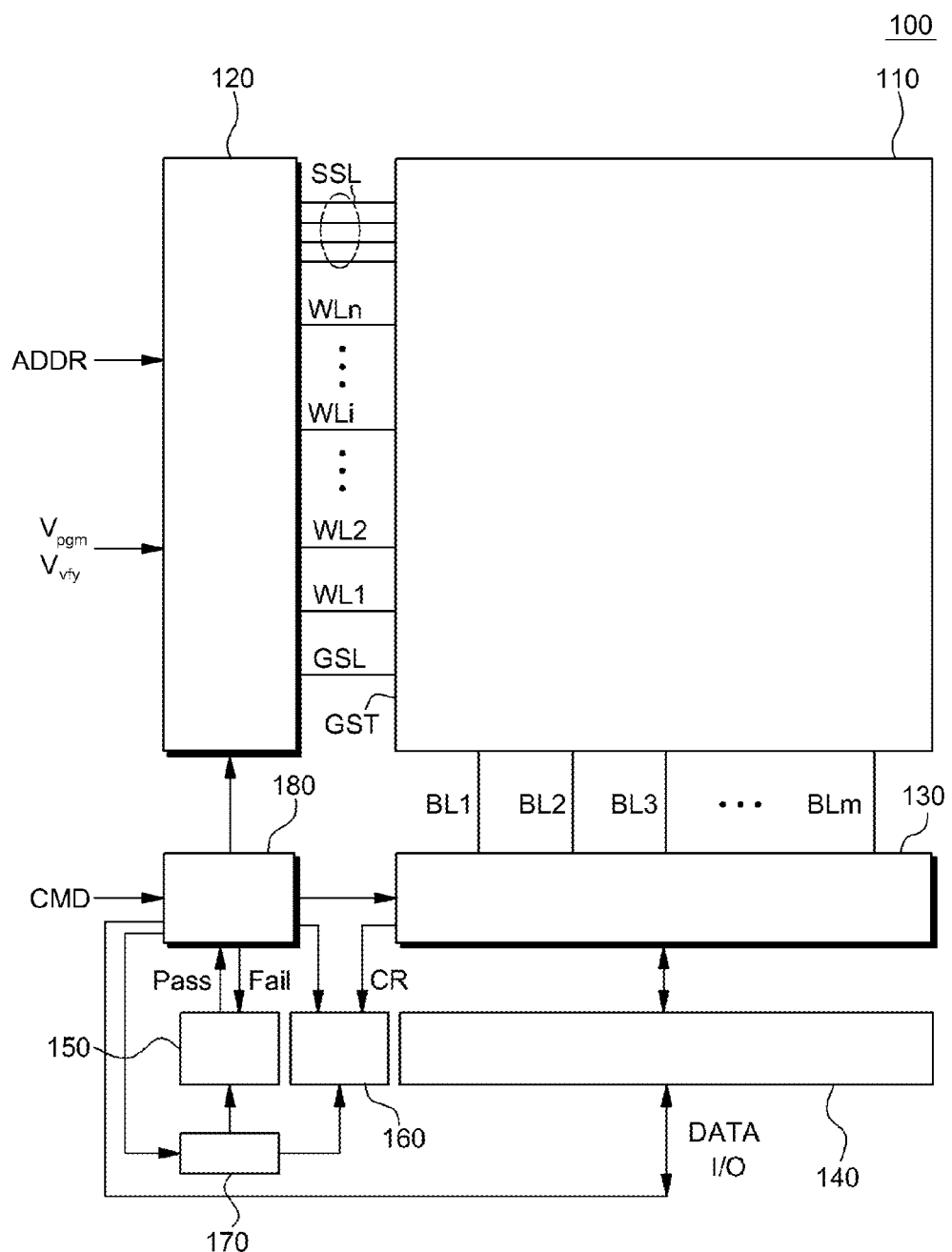
FIG. 1 is a block diagram of a 3-dimensional non-volatile memory device according to an embodiment of the present disclosure.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

FIG. 1 is a block diagram of a 3-dimensional non-volatile memory device 100 according to an embodiment of the present disclosure.

Referring to FIG. 1, the 3-dimensional non-volatile memory device 100 may include a memory cell array 110 comprising a plurality of memory cells, a row decoder 120, a read/write circuit 130, and a column decoder 140. The memory cell array 110 may be connected to the row decoder 120 via wordlines WL1, WL2, . . . , WLi, . . . , and WLn, string select lines SSL, and a ground select line GSL. Furthermore, the memory cell array 110 may be connected to the read/write circuit 130 via bitlines BL1, BL2, BL3, . . . , and BLn.

If the 3-dimensional non-volatile memory device 100 is a NAND flash memory device, the memory cell array 110 may include memory cell strings (not shown) in which a plurality of memory cells are electrically connected in series. At least two or more string select transistors may be connected first ends of the memory cell strings, whereas a ground select transistor may be connected to second ends of the memory cell strings. A common source line may be electrically connected to the second ends of the memory cell strings, and the first ends of the ground select transistors may be electrically connected to the common source line. The wordlines WL1, WL2, . . . , WLi, . . . , and WLn may be connected to control gates of memory cells arranged in a column-wise direction, respectively. The bitlines BL1, BL2, BL3, . . . , and BLn may be electrically connected to first ends of the string select transistors, respectively.

A plurality of memory cells that are arranged in a row-wise direction and include control gate electrodes respectively coupled with the wordlines WL1, WL2, . . . , WLi, . . . , and WLn constitute a logical page, where the number of the logical pages may be determined based on storage capacity of the memory cells. For example, according to storage levels, a single level cell (SLC) memory device, in which each memory cell stores 1 bit, a multi-level cell (MLC) memory device, in which each memory cell stores 2 bits, a 8LC memory device, in which each memory cell stores 3 bits, and a 16LC memory device, in which each memory cell stores 4 bits may be provided.

Memory cells of the memory cell array 110 may be arranged in a 3-dimensional array structure parallel or vertical to the main surface of a semiconductor substrate as described below.

The memory cells constituting the page may be programmed in a same program cycle. For example, memory cells connected to the wordline WL1 may be programmed to an identical program state (or have a target value) or different program states in a same program cycle. For example, in a single program cycle, a memory cell may be programmed to a first program state P1, another memory cell adjacent thereto may be programmed to a second program state P2, and the other memory cells may be programmed to a third program state P3. However, the case is merely an example, and the present disclosure is not limited thereto. According to another embodiment, in case of single level cells having an interleaved architecture, even-numbered cells and odd-numbered cells may constitute two pages different from each other. For example, a 4 kb SLC device may include wordlines for 65,536 memory cells. Furthermore, in case of a MLC device, since each cell stores one least significant bit (LSB) and one most significant bit (MSB), the MLC device has four pages. For example, in this case, MSB pages and LSB pages on even-numbered bitlines and MSB pages and LSB pages on odd-numbered bitlines may be provided.

The row decoder 120 may select the plurality of string select lines SSL or may drive the plurality of string select lines SSL by applying voltage or current thereto.

Furthermore, the row decoder 120 may select any one of wordlines of a memory block. The row decoder 120 may apply a wordline voltage $V_{WL}$ from a voltage generator (not shown) to the selected wordline of the selected memory block. During a programming operation, the row decoder 120 may apply a program voltage VPGM and a verification voltage VVFY to a selected wordline and apply pass voltage VPASS to an unselected wordline.

The cell array 110 may be addressed by the bitlines BL1, BL2, BL3, . . . , and BLn via the column decoder 140. The read/write circuit 130 may receive data transmitted from the outside or may transmit data to the outside via the column decoder 140.

The read/write circuit 130 may include a page buffer (not shown) and may operate as a detection amplifier or a write driver according to operation modes. However, in the present specification, a read/write circuit and a page buffer may be used as equivalent terms and shall be understood as inter-compatible terms. For example, during a writing operation, the read/write circuit 130 receives data from an external circuit and transmits a bitline voltage corresponding to data to be written to a bitline of the cell array 110. During a read operation, the read/write circuit 130 may read out data stored in a selected memory cell via a bitline, latch the read-out data, and output the latched data to the outside.

The read/write circuit 130 may perform a verification operation in association with a writing operation regarding a memory cell in response to a transmission signal transmitted from a control circuit 170 and, in response to the transmission signal, may output a result of the verification read operation as page buffer signals over a plurality of number of times. According to an embodiment, the read operation of the read/write circuit 130 may be performed based on charge integration using a bitline parasitic capacitor.

According to an embodiment of the present disclosure, when memory cells are programmed page by page, memory cells may be programmed page by page using the ISPP algorithm. The verification algorithm for checking whether a threshold voltage $V_{THR}$ of a corresponding memory cell reached the level of the level of a target voltage Vth may be performed by the current sensing circuit coupled with the bitline. According to an embodiment, the current sensing circuit may be included in the read/write circuit 130.

The control logic 180 may execute program-verify loops based on the ISPP algorithm, thereby programming selected memory cells. The pass/fail verifying circuit 150 verifies whether a memory cell is at a desired level during the verification operation every time a program loop count increases. If a memory cell has a desired threshold voltage, that is, a target value, it is determined as a program pass and operations for programming and verifying program regarding the corresponding memory cell are terminated. However, if the memory cell does not have a desired threshold value, that is, a target value, it is determined as a program fail, and the pass/fail verifying circuit 150 may generate a count signal (not shown). The pass/fail verifying circuit 150 may determine success of a program operation and transmit a result of the determination to the control logic 180.

In response to a command CMD, the control logic 180 may control the row decoder 120, the read/write circuit 130, the column decoder 140, the pass/fail verification circuit 150, the program loop turn detector 160, and/or the comparator 170 to perform a pulse-program operation and a verification operation based on the ISPP algorithm.

The control logic 180 may determine whether to terminate or continue a program operation based on success of a program operation (pass/fail) transmitted from the pass/fail verifying circuit 150. If a result of fail is received from the pass/fail verifying circuit 150, the control logic 180 will control a voltage generator (not shown) that generates a program voltage $V_{pgm}$ and a verification voltage $V_{vfy}$ and a page buffer 130 to proceed a follow-up program loop. As described above, in order to proceed a programming operation according to the increasing number of program loops, the control logic 180 may receive program loop turns. On the contrary, if the control logic 180 receives a result of pass, a program operation regarding selected memory cells will be terminated.

In various designs, the control logic 180 may be integrated on a same chip with the memory cell array 110 or may be arranged on a different chip, where the present disclosure is not limited thereto. For example, as in a solid state drive (SSD), the control logic 180 may be provided at a flash translation layer (FTL), which is an independent chip separated from the memory cell array 110.

Furthermore, although the pass/fail verification circuit 150, the program loop turn detector 160, and the comparator 170 described above are formed separately from the control logic 180, the present disclosure is not limited thereto. For example, at least one of the pass/fail verification circuit 150, the program loop turn detector 160, and the comparator 170 may be embodied as software or hardware in the control logic 180. Furthermore, it is obvious that at least one of the pass/fail verification circuit 150, the program loop turn detector 160, and the comparator 170 may be omitted or another circuit component may be added.

Figure 2A:
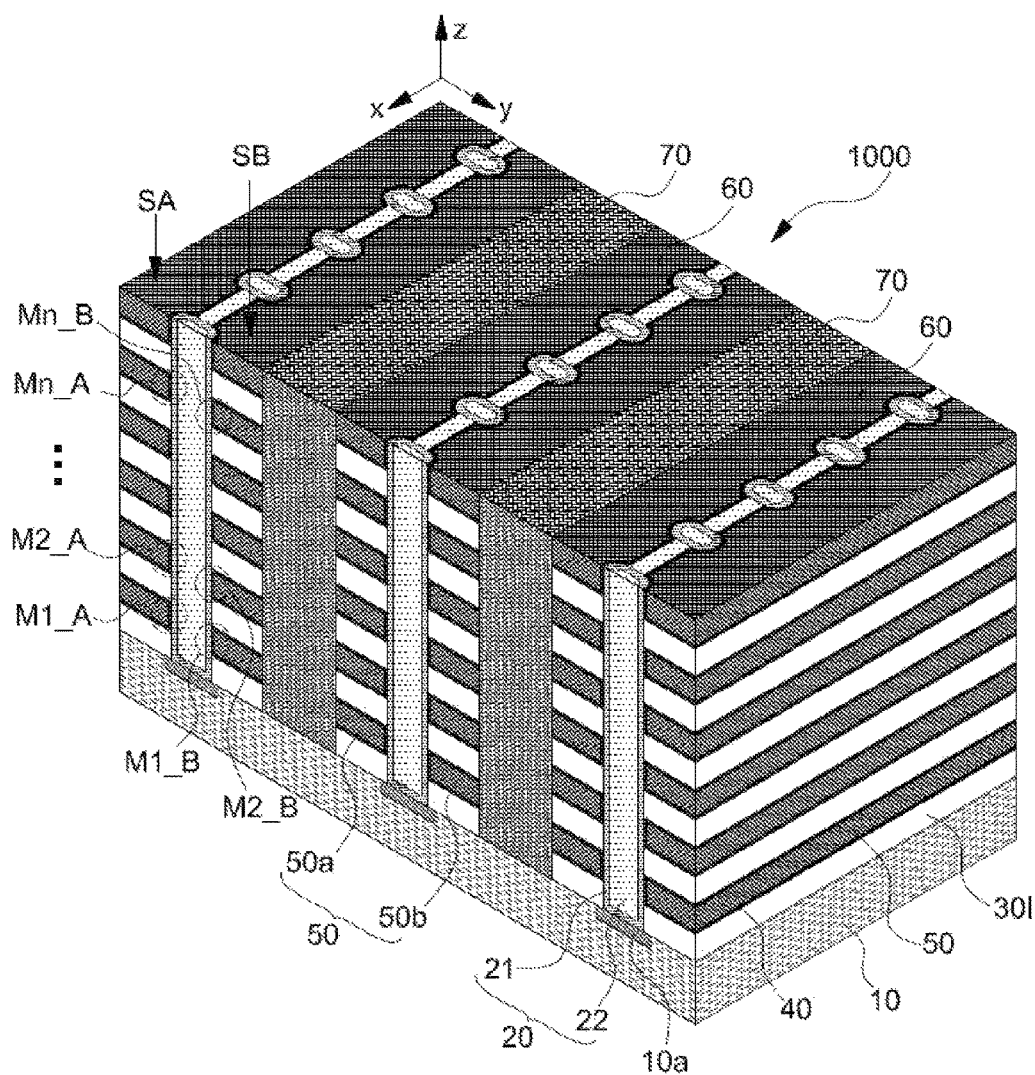
FIG. 2A is a perspective view of a structure of a 3-dimensional non-volatile memory device including memory cells for implementing a memory cell array according to an embodiment.
Figure 2B:
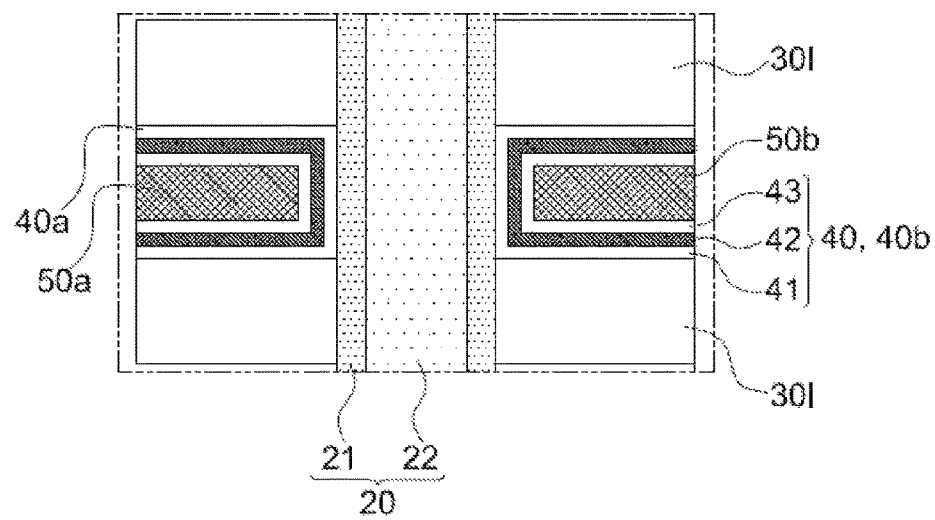
FIG. 2B is a cross-sectional view of a structure of a memory cell according to an embodiment.

FIG. 2A is a perspective view of a structure of a 3-dimensional non-volatile memory device 1000 including memory cells M1_A and M1_B; M2_A and M2_B; . . . ; and Mn_A and Mn_B for implementing a memory cell array (refer to 110 of FIG. 1) according to an embodiment, and FIG. 2B is a cross-sectional view of a structure of a memory cell according to an embodiment. In the FIG. 2A, x-axis and y-axis may be parallel to a main surface 10S of the substrate 10. A z-axis may be vertical to the main surface 10S of the substrate 10.

Referring to FIG. 2A, the 3-dimensional non-volatile memory device 1000 may include a plurality of memory cells M1_A and M1_B; M2_A and M2_B; . . . ; and Mn_A and Mn_B that may be aligned in the x-axis direction (hereinafter referred to as a first direction) and the y-axis direction (hereinafter referred to as a second direction) different from the x-axis direction, and the z-axis direction (hereinafter referred to as a vertical direction) and, therefore, the plurality of memory cells M1_A and M1_B; M2_A and M2_B; . . . ; and Mn_A and Mn_B may be 3-dimensionally arranged. In an embodiment, the first direction (x-axis direction) and the second direction (y-axis direction) may be perpendicular to each other.

The substrate 10 may be a semiconductor substrate, such as a Si monocrystalline substrate, a compound semiconductor substrate, an SOI substrate, and a strained substrate, but the present disclosure is not limited thereto. For example, substrate 10 may be a ceramic substrate, a polymer substrate for implementing a flexible device, or even a fabric layer. A wire may be provided on a surface of the substrate 10 by forming an impurity region 10a via a doping process or by forming a conductive film (not shown). The wire may be a source line to which an end of a memory string is coupled.

Semiconductor pillars 20 for providing channels to the plurality of memory cells M1_A and M1_B; M2_A and M2_B; . . . ; and Mn_A and Mn_B may penetrate through an interlayer insulation film 30I and extend in the vertical direction, for example, the z-axis direction on the substrate 10. According to an embodiment, the semiconductor pillar 20 may include a semiconductor layer 21 and a core insulator 22 extending in the vertical direction (the z-axis direction). The semiconductor layer 21 may be formed on the core insulator 21. The semiconductor layer 21 may be a single layer or a composite layer in which a plurality of semiconductor layers may be stacked, wherein at least a portion thereof may be doped with an impurity. According to another embodiment, the semiconductor pillars 20 may be formed entirely of a semiconductor material without the core insulator 22.

Based on whether the 3-dimensional non-volatile memory device 1000 has a bit cost scalable (BiCs) structure, a vertical-recess-array-transistor (VRAT) structure, or a terabit cell array transistor (TCAT) structure known in the art, the semiconductor material of the semiconductor pillars 20 may include a suitable conductivity type or intrinsic poly-silicon. According to another embodiment, the channel lines may include monocrystalline silicon or a compound semiconductor that is not a conventional silicon material, a carbon-based material, a polymeric material, or other suitable channel material. If the semiconductor layer 22 is poly-silicon, the thickness of the semiconductor layer 21 may be from about 8 nm to about 12 nm, for example. When the thickness of the semiconductor layer 21 is less than 8 nm, a malfunction may occur due to reduction of an operation current. When the thickness of the semiconductor layer 21 exceeds 22 nm, the size of grain boundary increases, and accordingly charge trap increases so that distribution of threshold voltage may widen.

The semiconductor pillars 20 are arranged on the substrate 10 apart from one another in the first direction (the x-axis direction) and in the second direction (the y-axis direction). The semiconductor pillars 20 are separated from one another by a device isolating insulation film 70 extending in the first direction (the x-axis direction) and the third direction (the z-axis direction) and apart from each other in the second direction (the y-axis direction). The semiconductor pillars 20 arranged in the first direction (the x-axis direction) and separated by the device isolating insulation film 70 may be shared be configuring a pair of memory strings SA and SB separated by a string isolation film 60. For example, the left memory cells M1_A, M2_A, . . . , and Mn_A (hereinafter, a string consisting of the left memory cells is referred to as a first memory string) and the right memory cells M1_B, M2_B, . . . , and Mn_B (hereinafter, a string consisting of the right memory cells is referred to as a second memory string) share the one semiconductor pillar 20 coupled to the first memory string SA and the second memory string SB.

The first memory string SA and the second memory string SB may share the semiconductor pillar 20 and may function as independent memory strings, because an electrode layer 50a of the first memory string SA and an electrode Layer 50b are electrically isolated from each other and may operate as independent wordlines. For example, in a memory array according to an embodiment of the present disclosure, the electrode layers 50a coupled to the memory cells M1_A, M2_A, . . . , and Mn_A of the first memory string SA may constitute odd wordlines. The electrode layers 50b coupled to the memory cells M1_B, M2_B, . . . , and Mn_B of the second memory string SB may constitute even wordlines. On the contrary, the electrode layers 50a coupled to the memory cells M1_A, M2_A, . . . , and Mn_A of the first memory string SA may constitute even wordlines and the electrode layers 50b coupled to the memory cells M1_B, M2_B, . . . , and Mn_B of the second memory string SB may constitute odd wordlines. Hereinafter, the electrode layers 50a of the first memory string SA are referred to as first sub-lines, and the electrode layers 50b of the second memory string SB are referred to as second sub-lines.

The memory cells M1_A and M1_B; M2_A and M2_B; . . . ; and Mn_A and Mn_B stacked in the vertical direction (the z-axis direction) of each memory strings SA and SB are separated from one another by an interlayer isolation layer 30I. In the embodiment shown in FIG. 2A, a selection transistor and/or a ground selection transistor coupled to memory strings SA and SB to select the memory strings SA and SB are not shown, and the disclosure of FIG. 1 may be referred to regarding the selection transistor and/or the ground selection transistor. The memory cells in the memory strings SA and SB may be connected to one another in series to have a NAND flash configuration. According to an embodiment, the number of memory cells of each of the memory strings SA and SB may be 32 or 64, for example.

Referring to FIG. 2B, each memory cell may include an information storage film 40 for storing information between the semiconductor pillar 20 and the electrode layers 50A and 50B. According to an embodiment, the information storage film 40 may include a charge storage film 42, such as a floating gate or charge trapping layer, which is insulated by a tunneling insulation film 41 and a blocking insulation film 43, wherein the charge storage film 42 may function as an information storage layer. According to an embodiment, the plurality of memory cells having the charge trap layers may have a structure in which various materials are stacked in the order of a gate electrode, a blocking insulator film, a charge trapping layer, a tunneling insulation film, and a substrate, e.g., polysilicon-silicon dioxide-silicon dioxide-silicon (SONOS) structure, polysilicon-alumina-silicon nitride-silicon dioxide-silicon (SANOS) structure, tantalum or titanium nitride-alumina-silicon nitride-silicon (TANOS) structure, or metal-alumina-silicon nitride-silicon dioxide-silicon (MANOS) structure, or metal-alumina-silicon nitride-band engineered oxide-silicon (BE-MANOS) structure. However, the materials of the information storage film 40 are merely examples, and the present disclosure is not limited thereto. Various other candidate materials may be applied to the information storage film 40. The information storage film 40 includes a first information storage film 40a between the first sub-electrode 50a and the semiconductor pillar 20 arranged in the first direction and a second information storage film 40b between the second sub-electrode 50b and the semiconductor pillar 20 arranged in the first direction.

The information storage film 40 may be continuously coated not only onto a channel region of the semiconductor pillars 20 exposed between the interlayer insulation film 30I, but also onto the top and bottom surfaces of the interlayer insulation film 30I. The information storage film 40 may be coated to form a groove between the interlayer insulation film 30I and the conductive layers 50a and 50b filling the grooves may form a control gate of the NAND memory cell and a wordline coupled to the control gate. According to an embodiment, the information storage film 40 may also extend onto the sidewalls of the string isolation film 60.

The lower end of the semiconductor pillar 20 may be coupled to, for example, a common source line 10a as described above, and a bitline (not shown) may be coupled to the upper end of the semiconductor pillar 20. A string selection transistor may be provided between the bitline and a wordline of the topmost memory cell. Wordlines provided by the stacked electrode layers 50a and 50b may be patterned to a step-like shape, and thus a bias may be applied independently to a selected wordline via contact plugs (not shown) respectively contacting the wordlines.

Figure 3A:
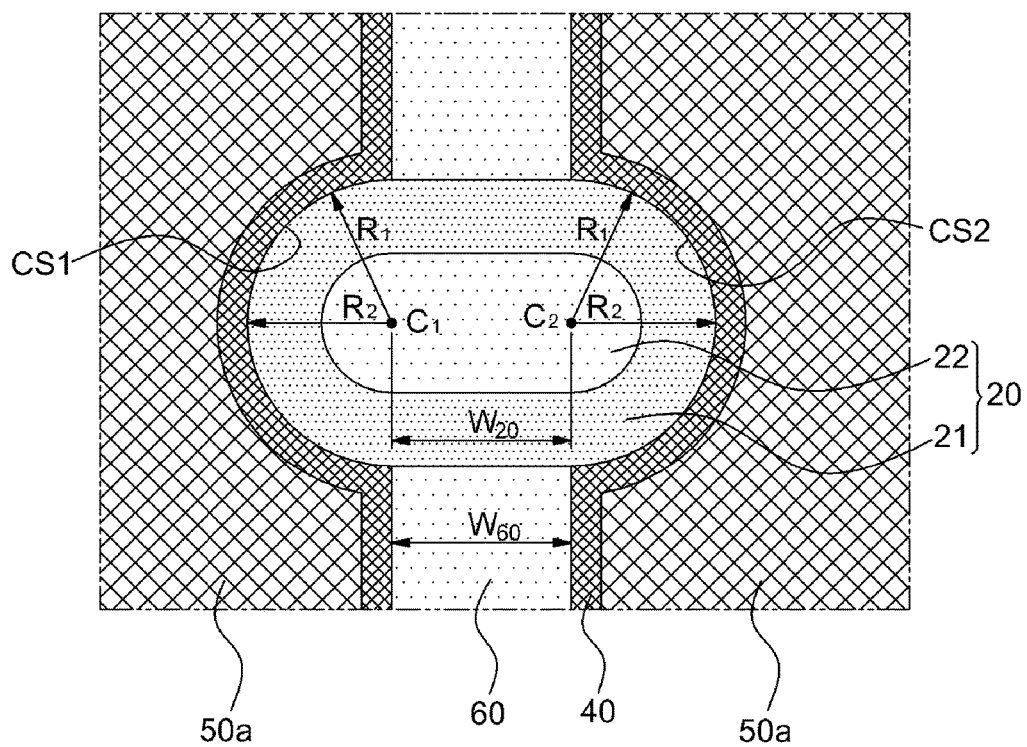
FIGS. 3A and 3B are cross-sectional views of a semiconductor pillar of a non-volatile memory device according to an embodiment in x-y directions.
Figure 3B:
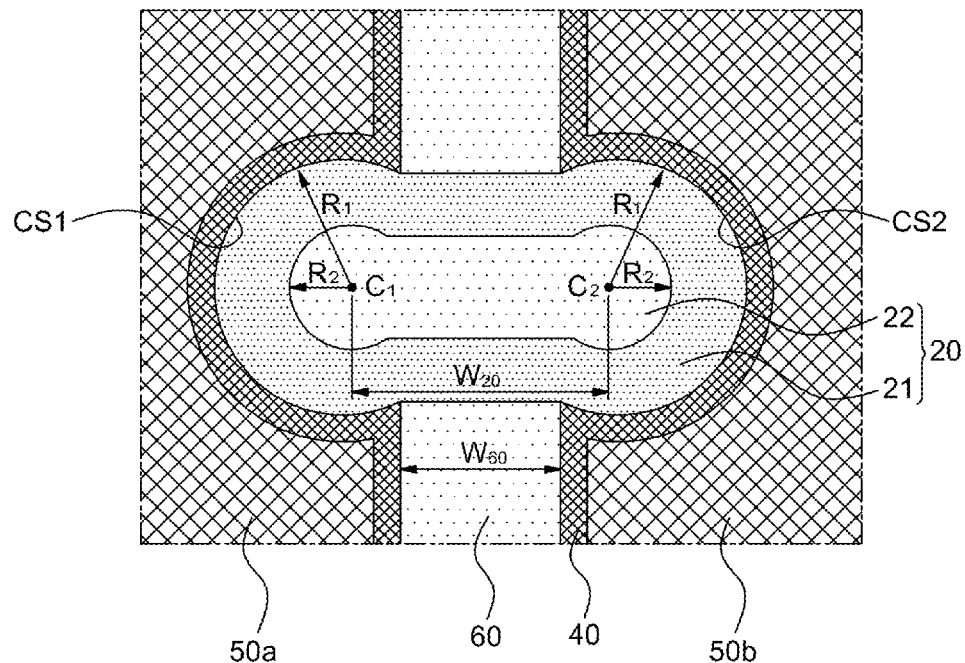
Figure 3C:
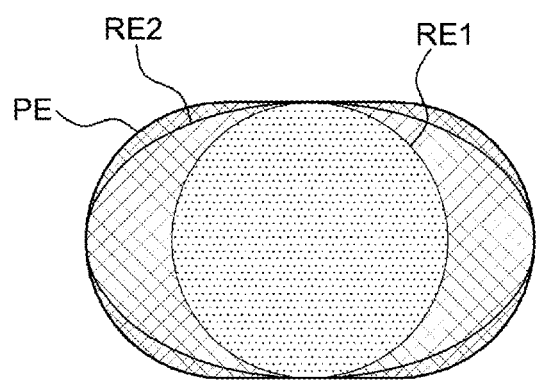
FIG. 3C is a cross-sectional view of a semiconductor pillar according to an embodiment and semiconductor pillars according to comparative embodiments.
Figure 3D:
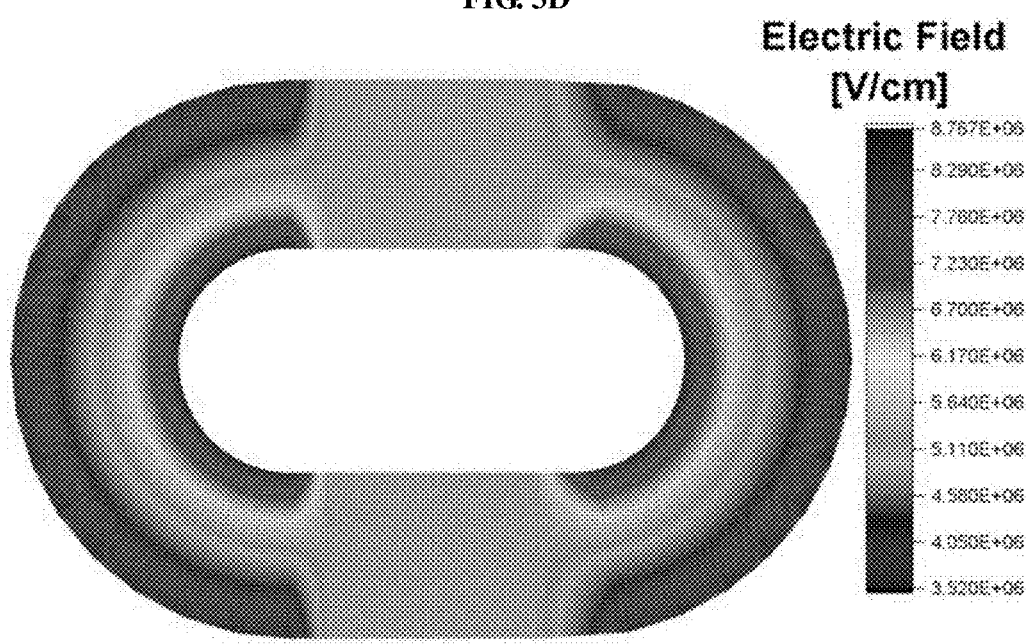
FIG. 3D is a diagram showing a result of a computer simulation of an electric field distribution regarding the semiconductor pillar shown in FIG. 3A, and FIGS. 3E and 3F are diagrams showing results of computer simulations of electric field distribution regarding semiconductor pillars PE having a circular cross-section and an elliptical cross-section according to comparative embodiments.
Figure 3E:
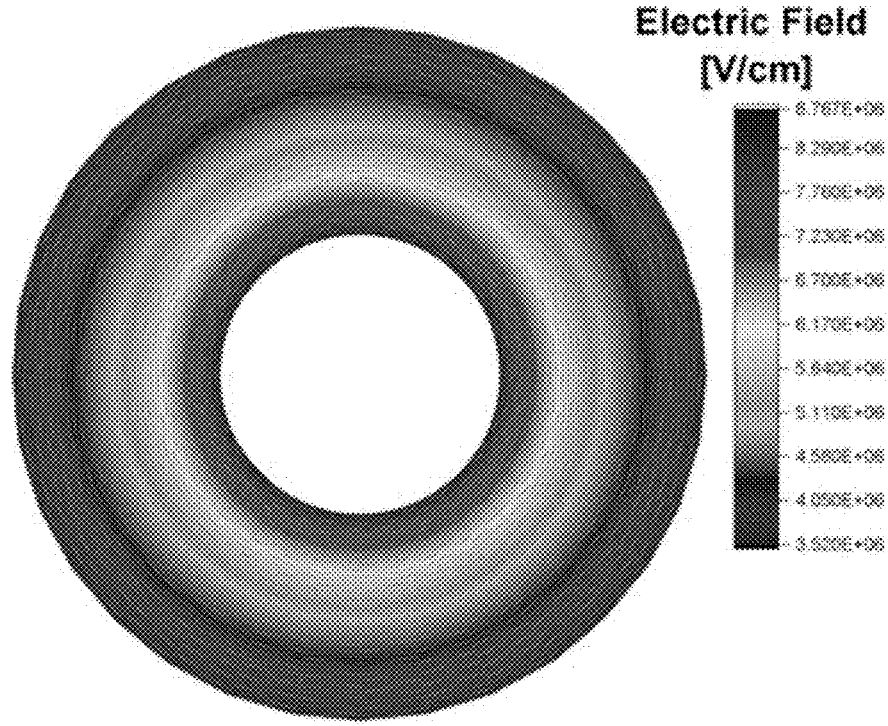
Figure 3F:
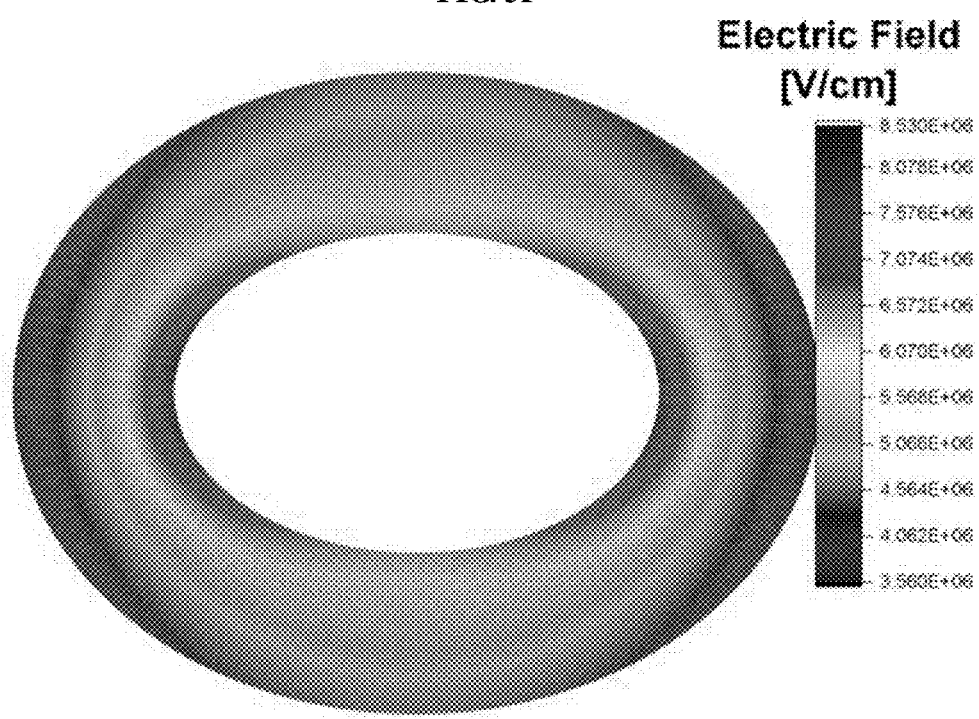

FIGS. 3A and 3B are cross-sectional views of the semiconductor pillar 20 of a non-volatile memory device according to an embodiment in x-y directions, FIG. 3C is a cross-sectional view of a semiconductor pillar PE according to an embodiment and semiconductor pillars RE1 and RE2 according to comparative embodiments. FIG. 3D is a diagram showing a result of a computer simulation of an electric field distribution regarding the semiconductor pillar PE shown in FIG. 3A, and FIGS. 3E and 3F are diagrams showing results of computer simulations of electric field distribution regarding semiconductor pillars PE having a circular cross-section and an elliptical cross-section according to comparative embodiments. In relation to FIGS. 3D to 3E, the color images of the corresponding FIGS. 3D to 3F of the Korean patent application No. 10-2016-0061462 can be referred to.

Referring to FIG. 3A, the information storage film 40 formed on the semiconductor pillar 20 of a nonvolatile memory device of the present disclosure and contact surfaces CS1 and CS2 against a first sub-electrode 50a and a second sub-electrode 50b may have circular arc cross-sections. Therefore, distances R1 and R2 from the centers C1 and C2 of the circular arc cross-sections of the contact surfaces CS1 and CS2 to the contact surfaces CS1 and CS2 may be constant along the entire contact surfaces CS1 and CS2. According to some embodiments, the circular arc cross-section may have a semicircular shape. In this case, the centers C1 and C2 of the circular arc cross-sections may have a width W20 identical to a thickness W60 of the string isolation film 60. The string isolation film 60 may be aligned to the center of the semiconductor pillar 20, and thus the left contact surface CS1 and the right contact surface CS2 become symmetrical. When the contact surfaces CS1 and CS2 have circular arc cross-sections, the distribution of an electric field and current flows between the first and second sub-electrodes 50a and 50b and the semiconductor pillar 20 during operation of a memory device become uniform along the contact surfaces CS1 and CS2. In the present specification, the cross-sectional shape of the semiconductor pillar 20 having circular arc cross-sections will be referred to as a round rectangular cross-sectional shape.

Referring to FIG. 3B, another example in which the contact surfaces CS1 and CS2 against the first sub-electrode 50a and the second sub-electrode 50b have circular arc cross-sections is disclosed. The string isolation film 60 is aligned to the center of the semiconductor pillar 20, and the left contact surface CS1 and the right contact surface CS2 become symmetrical. The distances R1 and R2 from the centers C1 and C2 of the circular arc cross-sections of the contact surfaces CS1 and CS2 to the contact surfaces CS1 and CS2 may be constant along the contact surfaces CS1 and CS2. However, the centers C1 and C2 of the circular arc cross-sections may have a width W20 greater than the thickness W60 of the string isolation film 60. Therefore, as compared to the contact surfaces CS_1 and CS_2 of FIG. 3A, channel regions may be further extended, and thus a turn-on current may be increased.

Referring to FIG. 3C, contact surfaces of the semiconductor pillar PE according to an embodiment of the present disclosure may secure a larger channel region as compared to the circular-type semiconductor pillar RE1t. Furthermore, as compared to the simple elliptical-type semiconductor pillar RE2, there is an advantage that the electric field distribution on the contact surface may be maintained constant when a memory device is driven. Therefore, according to an embodiment of the present disclosure, such a uniform distribution of an electric field in a volatile memory device may suppress uneven distribution of device performance of the memory cells and improve life span of the memory device.

Referring to FIG. 3D, the semiconductor pillar PE having a round rectangular cross-sectional shape according to an embodiment of the present disclosure has a radius in a circular arc region contacting a sub electrode is constant along a curved surface. Therefore, as in the semiconductor pillar having a circular cross-section shown in FIG. 3E, the semiconductor pillar PE having a round rectangular cross-sectional shape according to an embodiment of the present disclosure has a constant electric field distribution along the circular arc, and thus a region used as a memory cell may become the entire contact area in the circular arc direction. However, referring to FIG. 3F, the semiconductor pillar RE2 having an elliptical cross-sectional shape exhibits different electric field distributions along curved surfaces along the x-axis and the y-axis of an ellipse. An electric field is concentrated at an end of the x-axis end, and the intensity of the electric field at an end of the y-axis is lower than the intensity of the electric field at an end of the x-axis. As a result, in a semiconductor pillar having an elliptical cross-section, only a region close to ends of the x-axis functions as memory cell regions. Therefore, in the semiconductor pillar RE2 having the elliptical cross-sectional shape, it is difficult or impossible to control a threshold voltage by using an entire channel, and thus efficiency and reliability are deteriorated when a memory is driven.

FIGS. 4A through 4L are cross-sectional views sequentially showing a method of fabricating a 3-dimensional nonvolatile memory device according to an embodiment of the present disclosure, and FIGS. 5A through 5L are plan views corresponding to the cross-sectional views of FIGS. 4A through 4L, respectively.

Figure 4A:
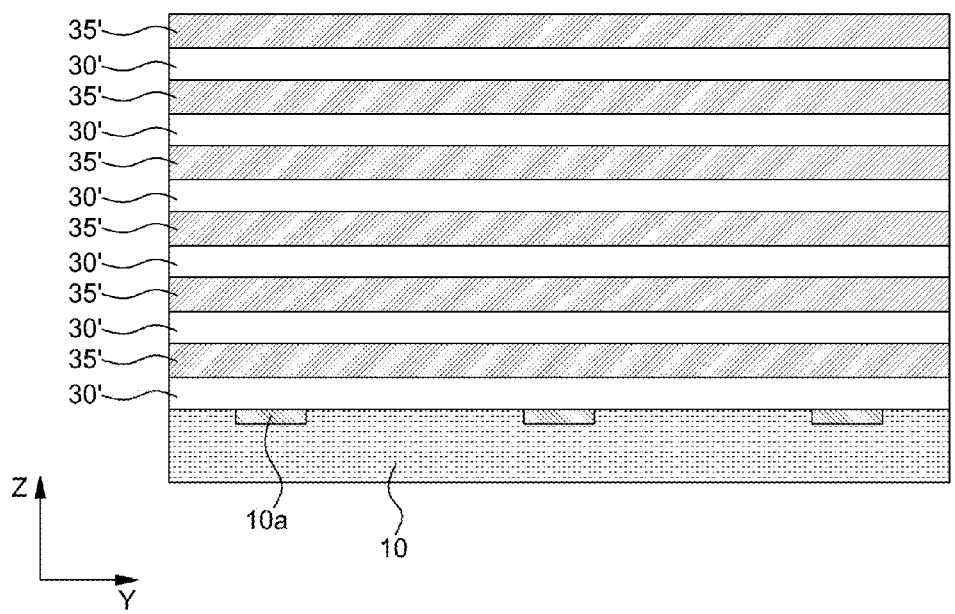
FIGS. 4A through 4L are cross-sectional views sequentially showing a method of fabricating a 3-dimensional nonvolatile memory device according to an embodiment of the present disclosure.
Figure 5A:
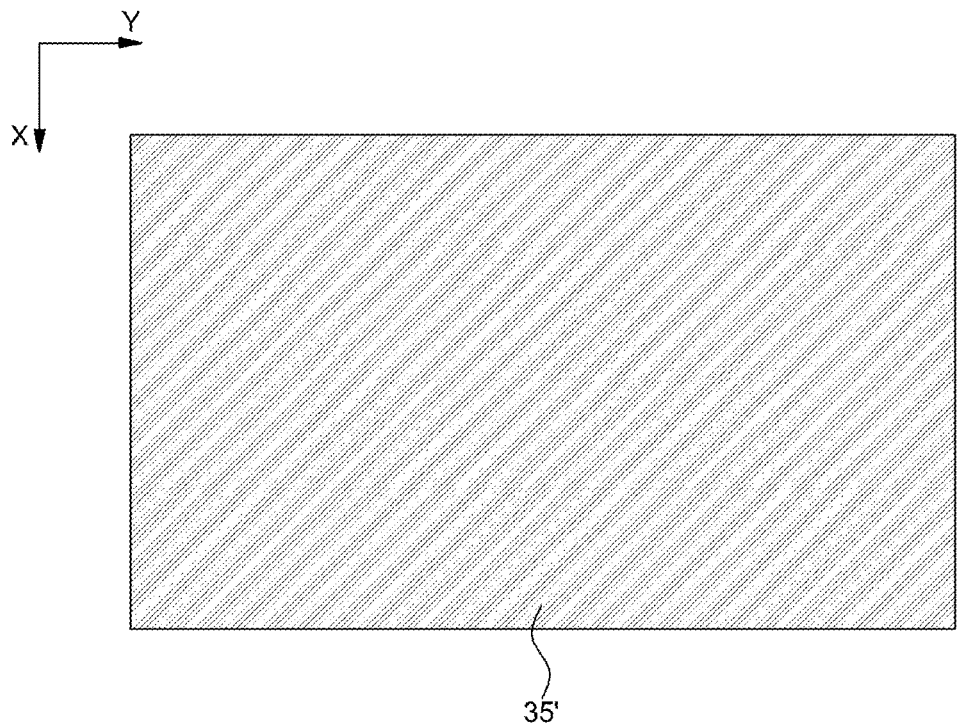

Referring to FIGS. 4A and 5A, the substrate 10 is provided. In the substrate 10, the impurity region 10a or a wire for forming a source line may be formed. In an example, various driving elements including transistors may be formed. An insulation film 30' and a sacrificing film 35' are alternately and repeatedly stacked on the substrate 10. The number of times of the repeated stacking may be determined in consideration of the numbers of memory cells, selection transistors, and grounding transistors. According to an embodiment, the sacrificing film 35' may be formed of a material having an etch selectivity with the insulation film 30'. For example, when the insulation film 30' includes a silicon oxide, the sacrificing film 35' may include a silicon nitride. The thicknesses of the insulating film 30' and the sacrificing film 35' may be determined in consideration of an interval between memory cells and the width of a gate electrode.

Figure 4B:
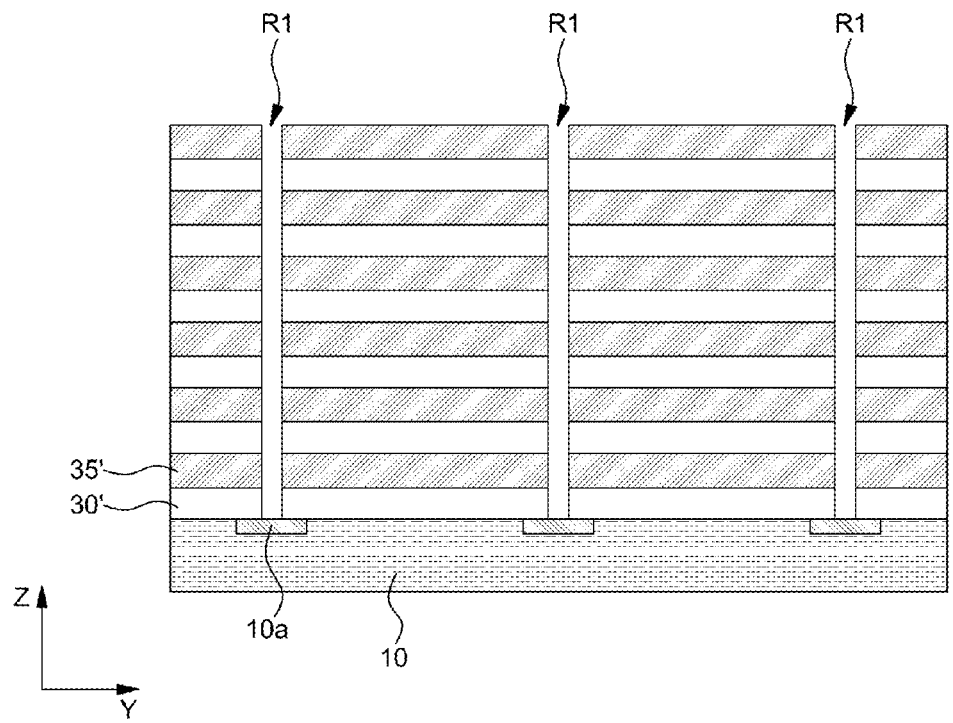
Figure 5B:
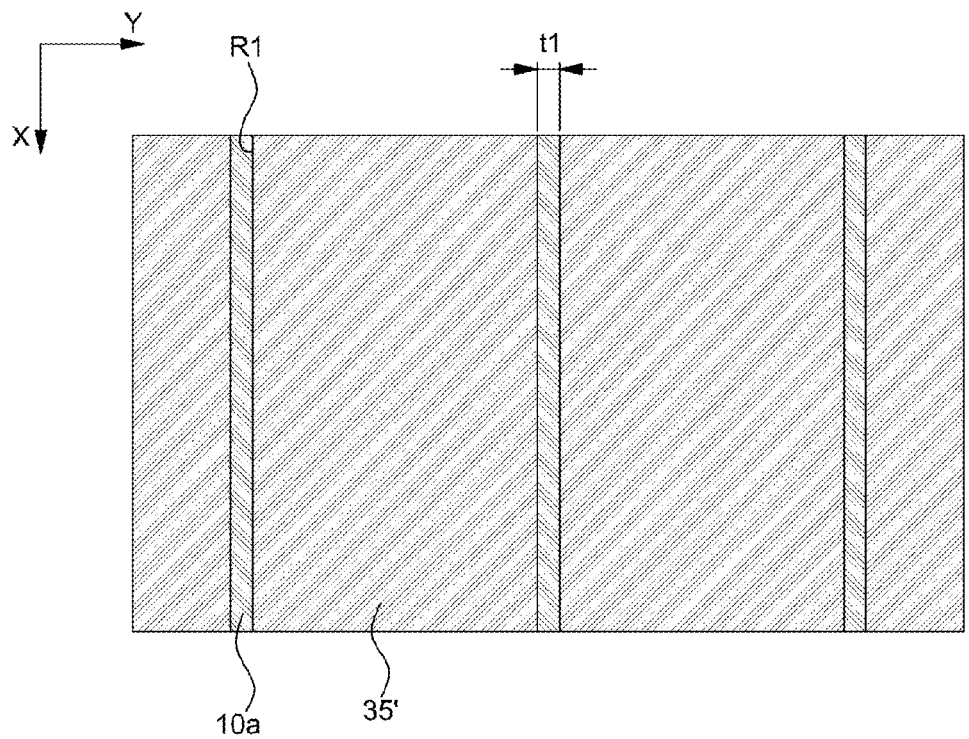

Referring to FIGS. 4B and 5B, the insulation film 30' and the sacrificing film 35' are sequentially patterned in the vertical direction (z-axis direction) to form a first trench region R1 (see FIG. 2). The first trench region R1 extends in the first direction (x-axis direction) and the vertical direction (z-axis direction) to divide the stacked insulating film 30' and the sacrificing film 35' into two parts around the first trench region R1. The width t1 of the first trench region R1 is smaller than the thickness of the semiconductor column (20 of FIG. 2) to be formed subsequently and the first trench region R1 may pass through the center of the semiconductor column. The first trench region R1 may have a flat plate-like structure having a uniform thickness t1, but the present disclosure is not limited thereto.

Figure 4C:
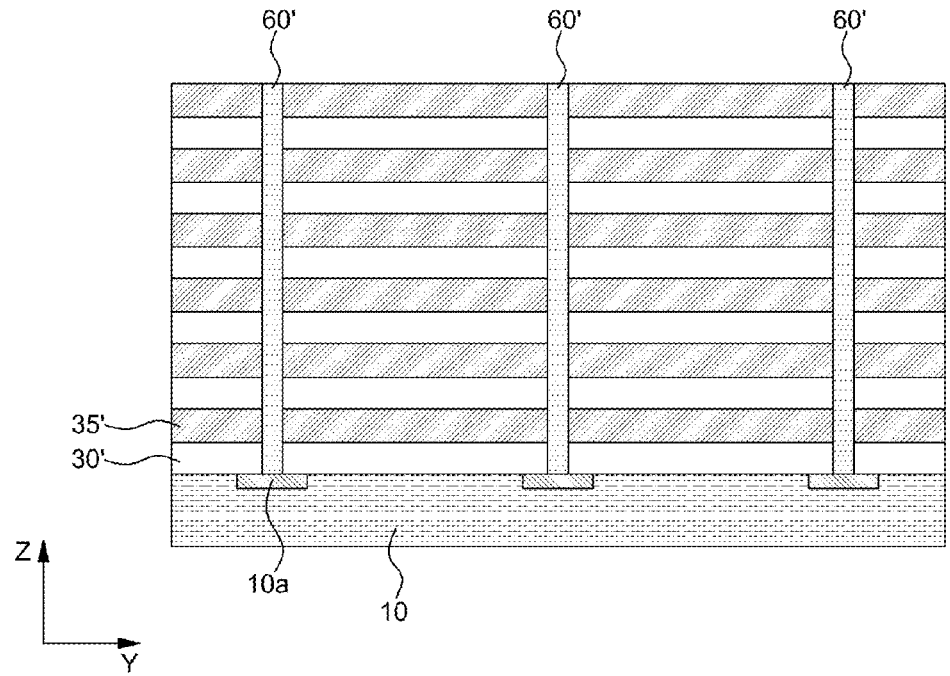
Figure 5C:
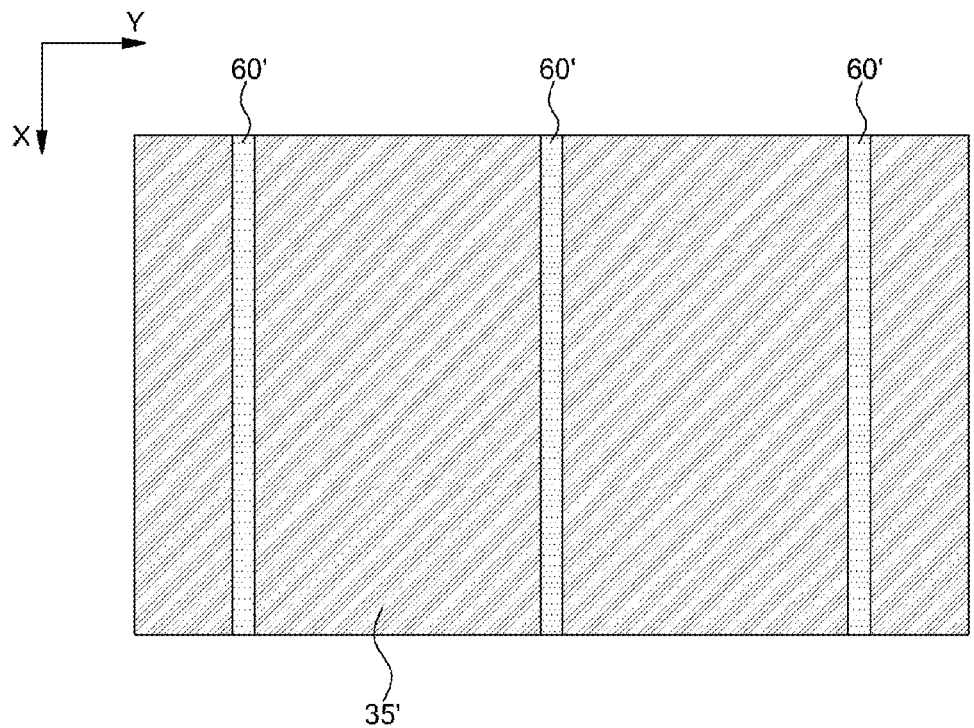

Referring to FIGS. 4C and 5C, the first trench region R1 may be filled with a first insulator 60' to be a string separation film. According to an embodiment, the first insulator 60' may be, for example, an insulator having an etch selectivity with the sacrificing film 35' and may be a silicon oxide film, for example. As known in the art, the formation of the first insulator 60' may be accomplished by filling the first trench region R1 with an insulating material for forming the first insulator 60' and removing the insulation material on the stack of the insulation film 30' and the sacrificing film 35' except the insulation material in the first trench region R1 via an etching operation, such as a chemical mechanical polishing (CMP) or an etch-back operation.

Figure 4D:
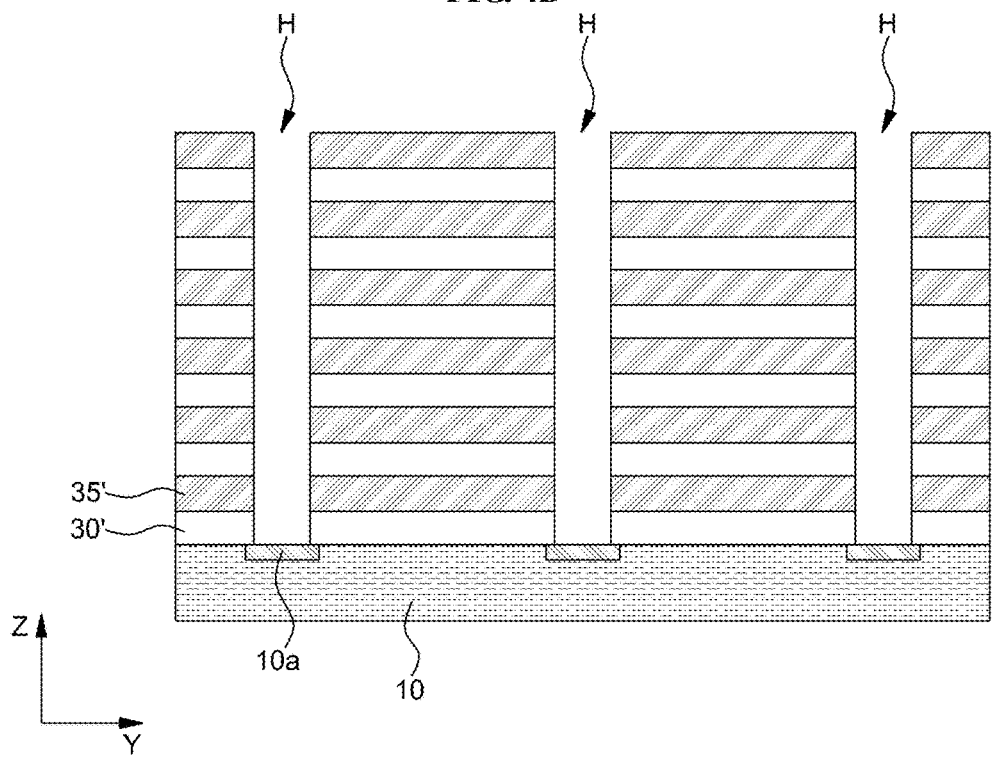

Referring to FIGS. 4D and 5D, holes H passing through the first insulator 60' and penetrating through the stack of the insulation film 30' and sacrificing film 35' repeatedly stacked in the vertical direction may be formed. The cross-sectional shape of the holes H may be a round corner rectangular shape having circular arcs of a same size on both sides, as described above with reference to FIGS. 3A and 3B.

Figure 4E:
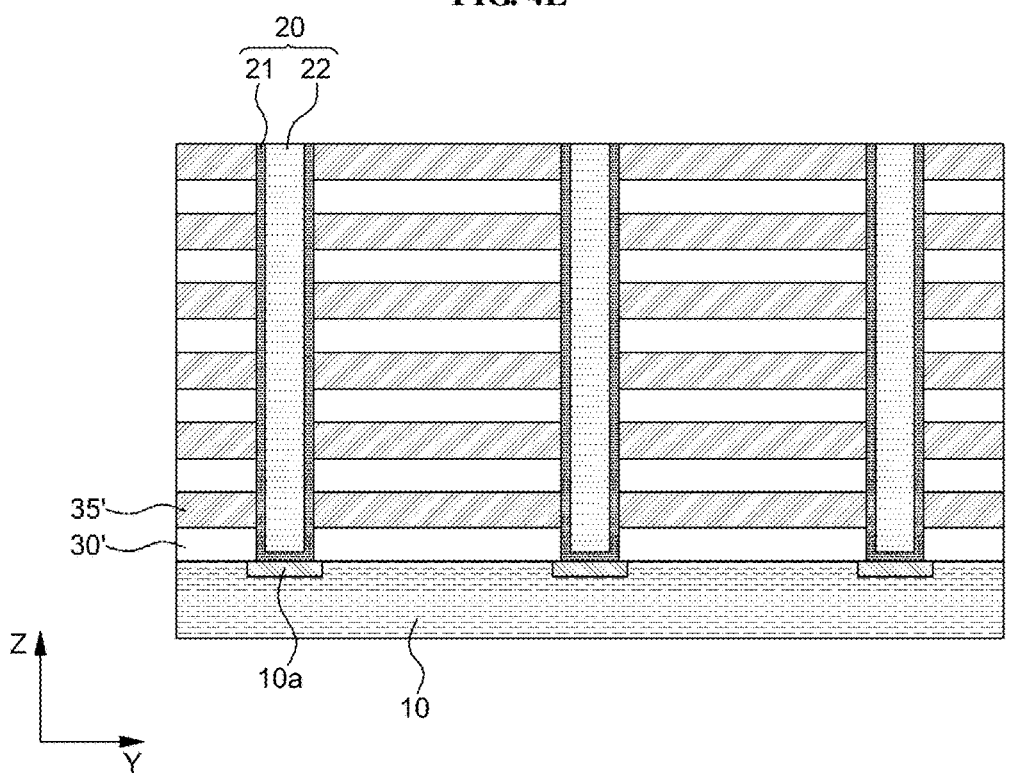

Referring to FIGS. 4E and 5E, semiconductor pillars 20 are formed in holes H, respectively. According to an embodiment, the semiconductor pillar 20 may be provided by forming the semiconductor layer 21 in holes H through a thin film formation operation, and then filling forming the core insulator 22 filling the holes H on the semiconductor layer 21. The bottom of the semiconductor layer 21 is formed to contact the substrate 10 and may be electrically connected to a source line 10a formed in the substrate 10. The semiconductor layer 21 may be polycrystalline or epitaxially-grown monocrystalline. Furthermore, the semiconductor layer 21 may have a stacked structure of at least two or more semiconductor layers, such as a silicon layer/germanium layer structure, but the present disclosure is not limited thereto. The semiconductor layer 21 may be formed through chemical vapor deposition or atomic layer deposition with a high step coverage.

The core insulator 22 may be formed of a silicon oxide having an etch selectivity with the sacrificing film 35', for example. As described above with reference to FIG. 2A, the semiconductor pillars 20 are vertically aligned on the substrate 10. In another example, the semiconductor pillars 20 may have a U-shape, such as a piped BiCs (P-BicS) structure known in the art. Furthermore, a semiconductor pillar formed of only a solid semiconductor layer without the core insulator 22 may be provided.

Figure 4F:
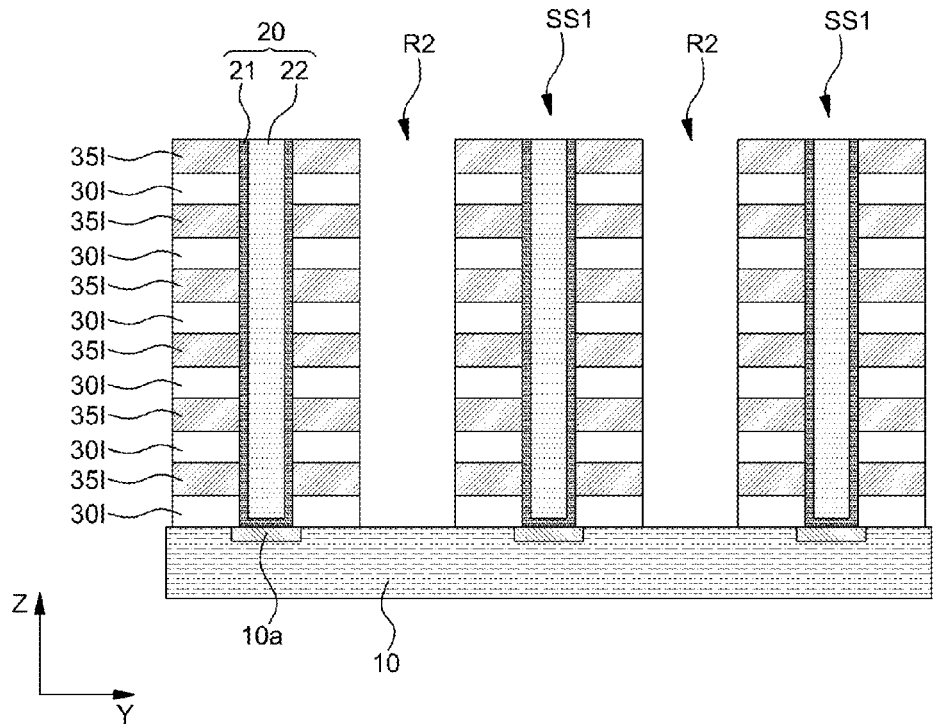
Figure 5F:
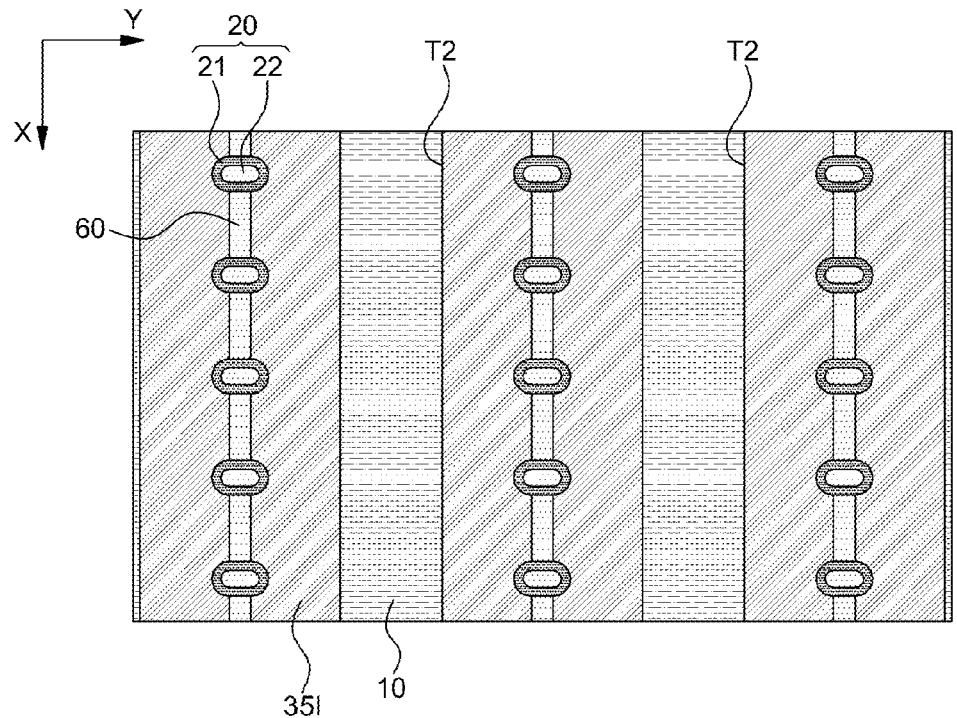

Referring to FIGS. 4F and 5F, on the substrate 10 on which the semiconductor pillars 20 may be formed, a second trench region R2 extending in the first direction (the x-axis direction) and the vertical direction (the z-axis direction) may be formed in a stacked structure of an insulation film 30I and a sacrificing film 35I. The second trench region R2 may divide the semiconductor pillars 20 aligned in the second direction (the y-axis direction), thereby forming a stacked structure SS1 of an insulation film pattern 30I and a sacrificing film pattern 35I. The stacked structure SS1 including the insulation film pattern 30I and the sacrificing film pattern 35I penetrated by the semiconductor pillars 20 aligned in the first direction (the x-axis direction) are divided by the second trench region R2 into two parts.

Figure 4G:
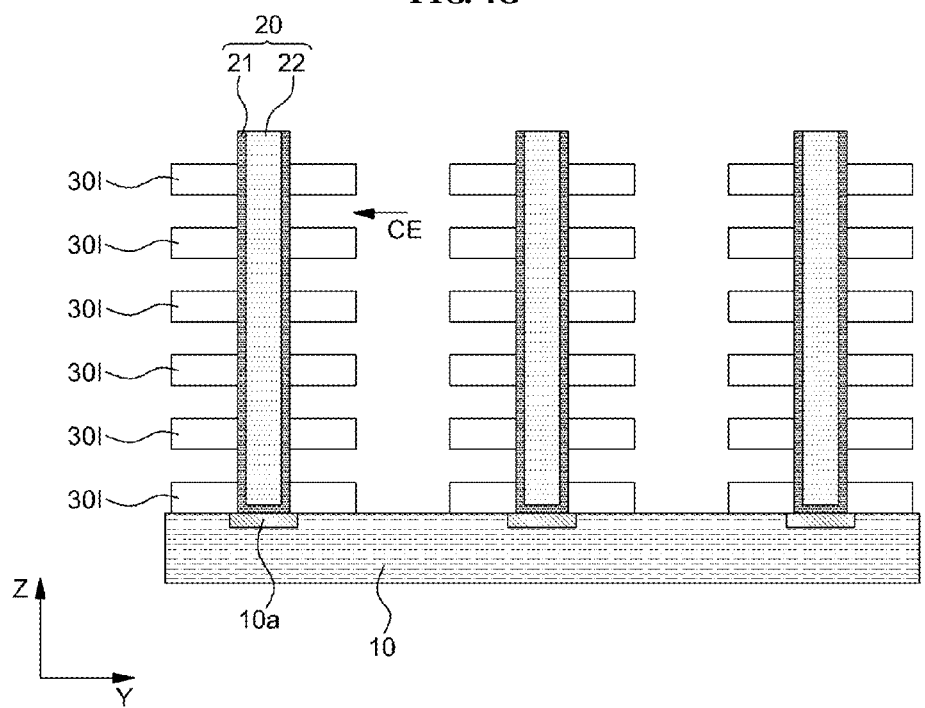
Figure 5G:
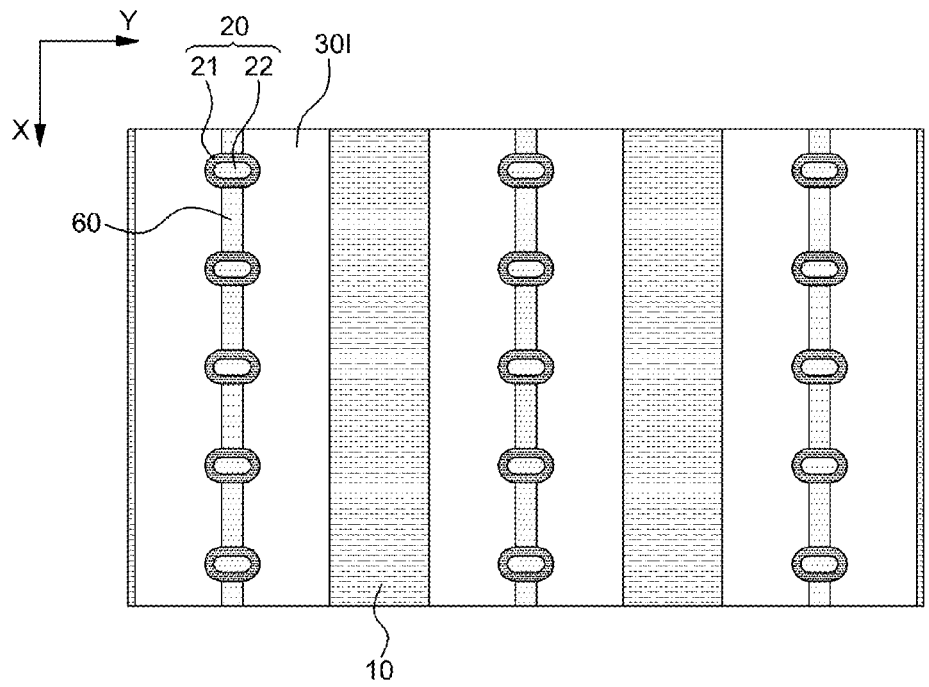

Referring to FIGS. 4G and 5G, the sacrificing film pattern 35I of the stacked structure SS1 including the insulation film pattern 30I and the sacrificing film pattern 35I exposed by the second trench region R2 may be removed. At this time, only the sacrificing film pattern 35I may be selectively removed through a wet etching operation by using the etching selectivity between the sacrificing film pattern 35I and the string isolation film 60. As a result, cell spaces CE in which the sidewalls of the semiconductor pillar 20 are exposed may be formed between the stacked insulation film patterns 30I.

Figure 4H:
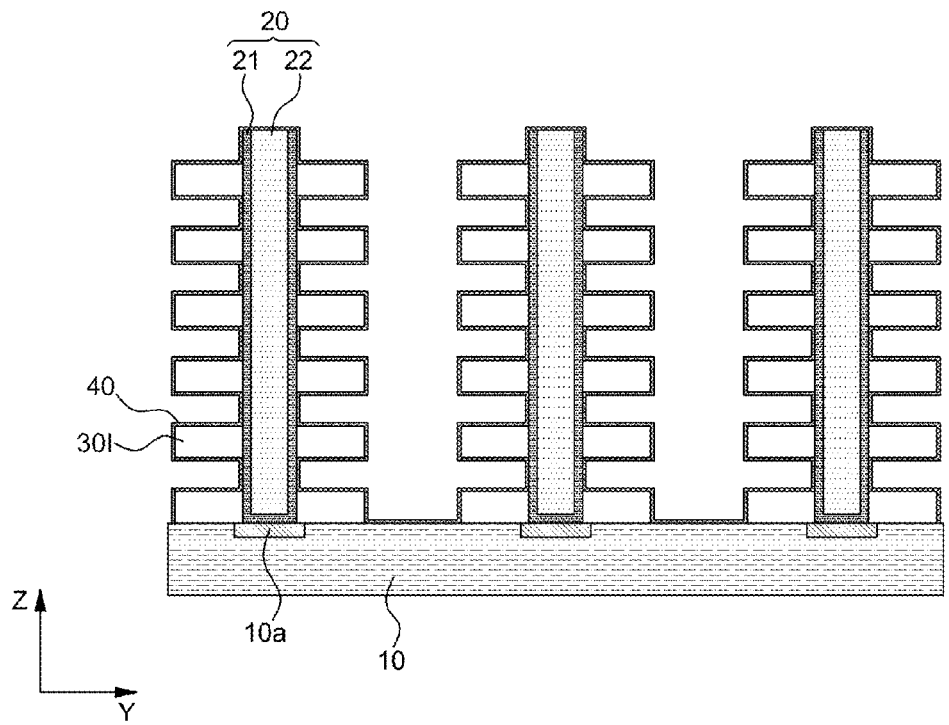
Figure 5H:
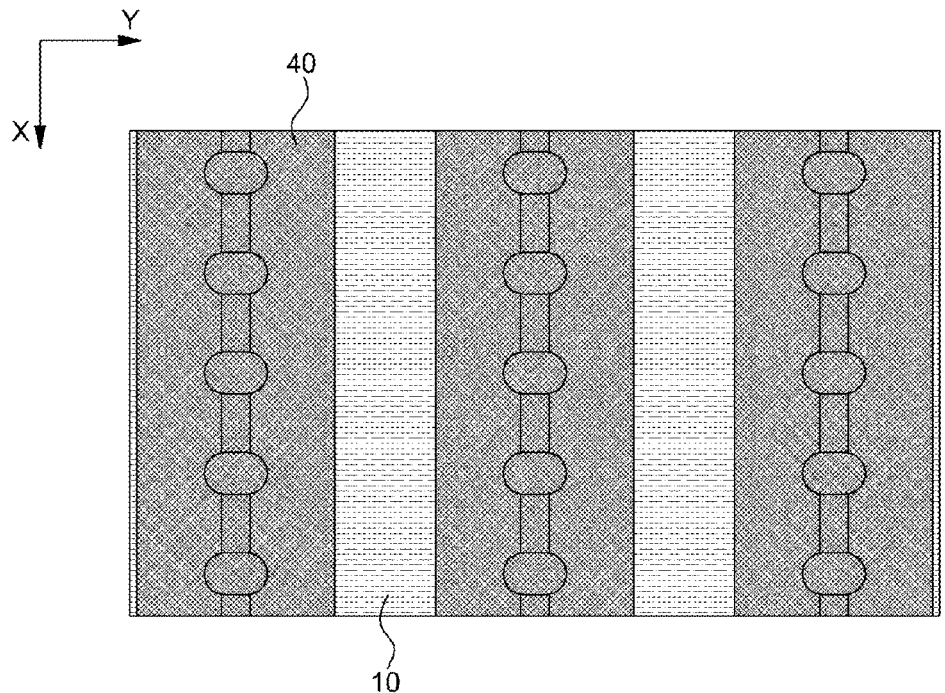

Referring to FIGS. 4H and 5H, the information storage film 40 is formed on the substrate 10 having the cell spaces CE formed therein. The information storage film 40 may be formed through a thin-film forming operation having excellent step coverage, e.g., a chemical vapor deposition or an atomic layer deposition. The information storage film 40 may include the charge storage film 42, such as a floating gate or charge trapping layer insulated by the tunneling insulation film 41 and the blocking insulation film 43, as shown in FIG. 2B.

Figure 4I:
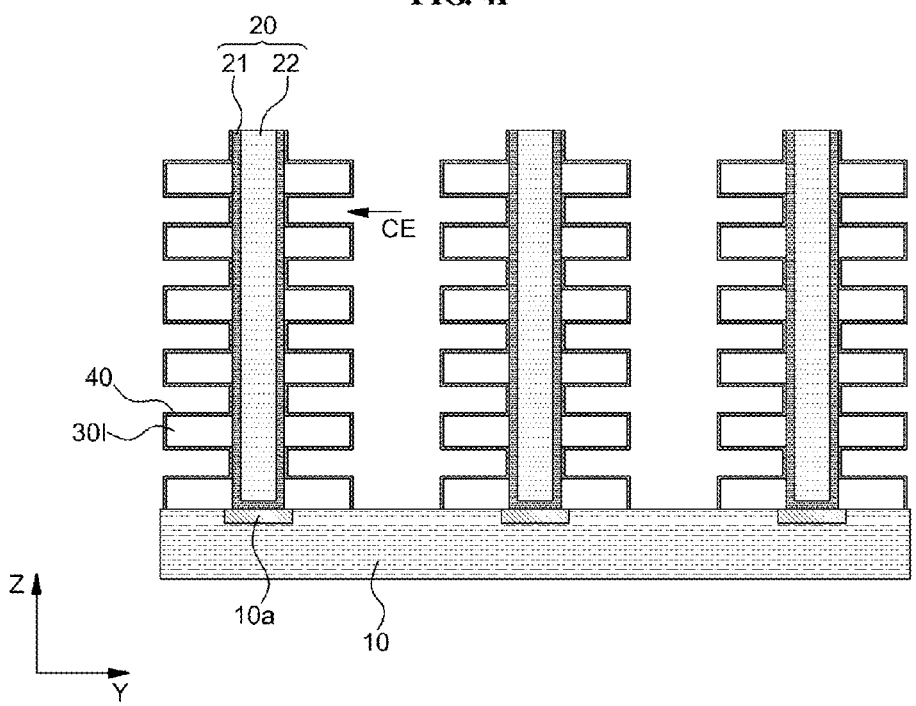
Figure 5I:
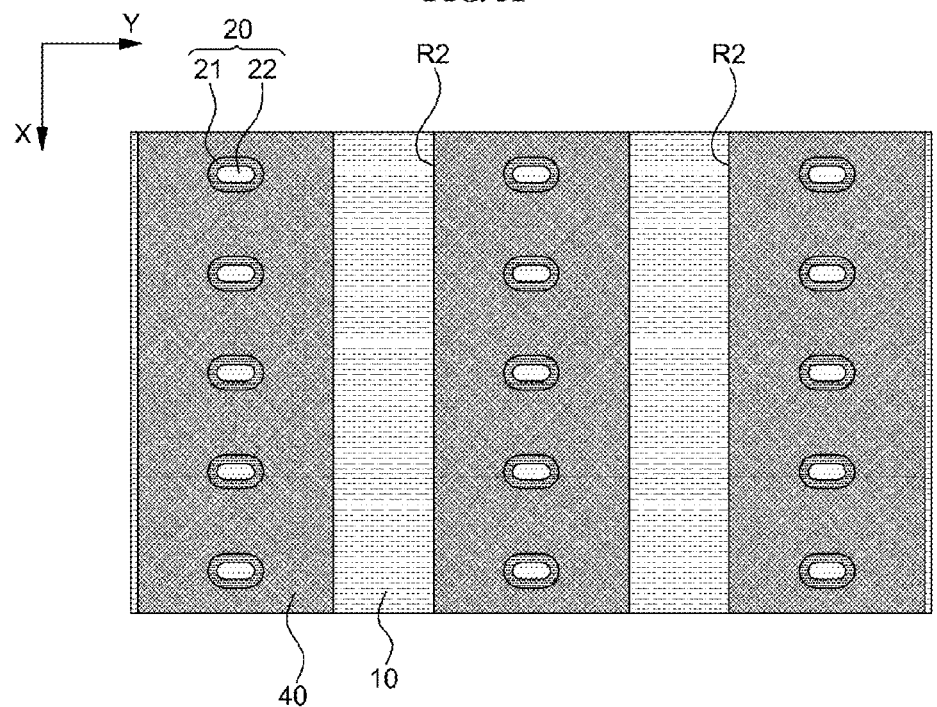

Referring to FIGS. 4I and 5I, the information storage film 40 on the surface of the semiconductor pillar 20 and/or the information storage film 40 on a surface of the substrate 10 exposed by the second trench region R2 may be removed. The removal of the information storage film 40 may be performed through an etch-back using plasma.

Figure 4J:
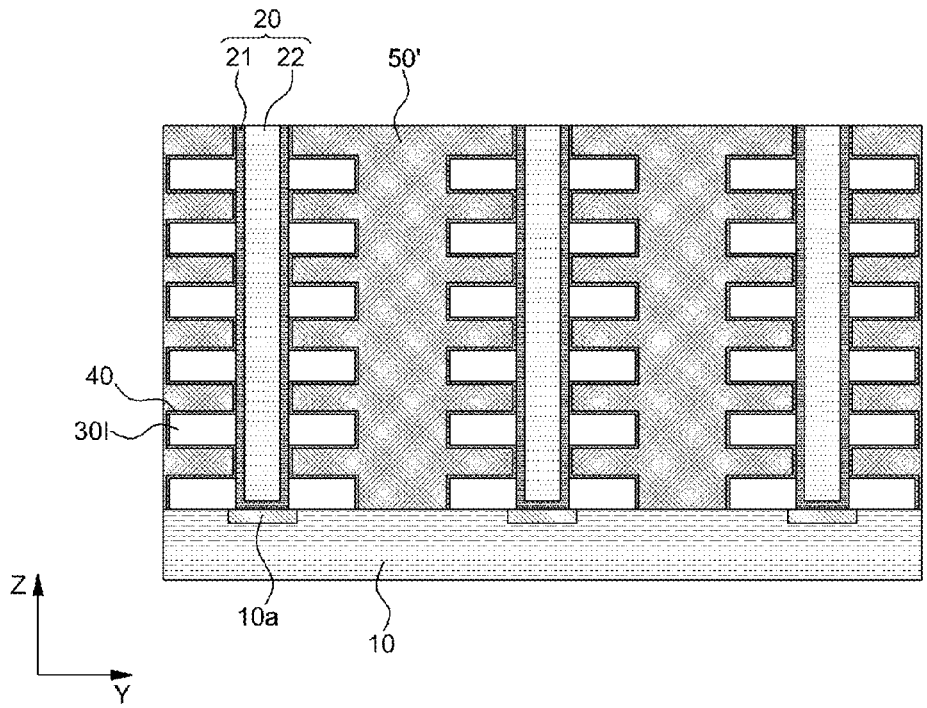
Figure 5J:
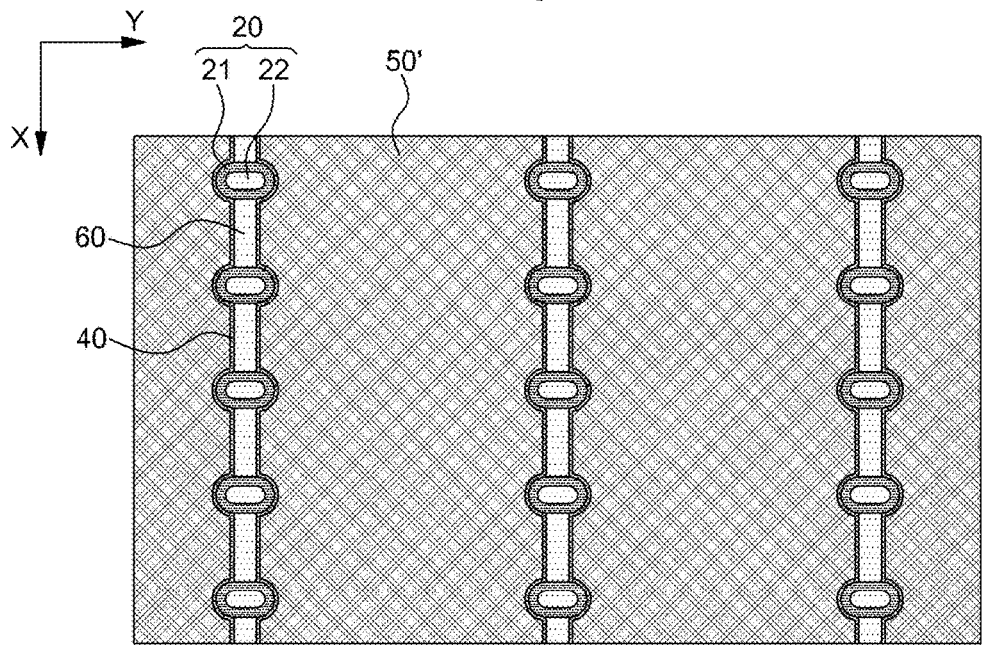

Referring to FIGS. 4J and 5J, a conductive film 50' filling at least some of the cell spaces CE in which the information storage film 40, may be formed. The conductive film 50' may include a single conductive film, such as a titanium nitride (TiN) film, or a stacked structure including two or more films, such as a titanium nitride film (TiN) and/or a tungsten (W) film.

Figure 4K:
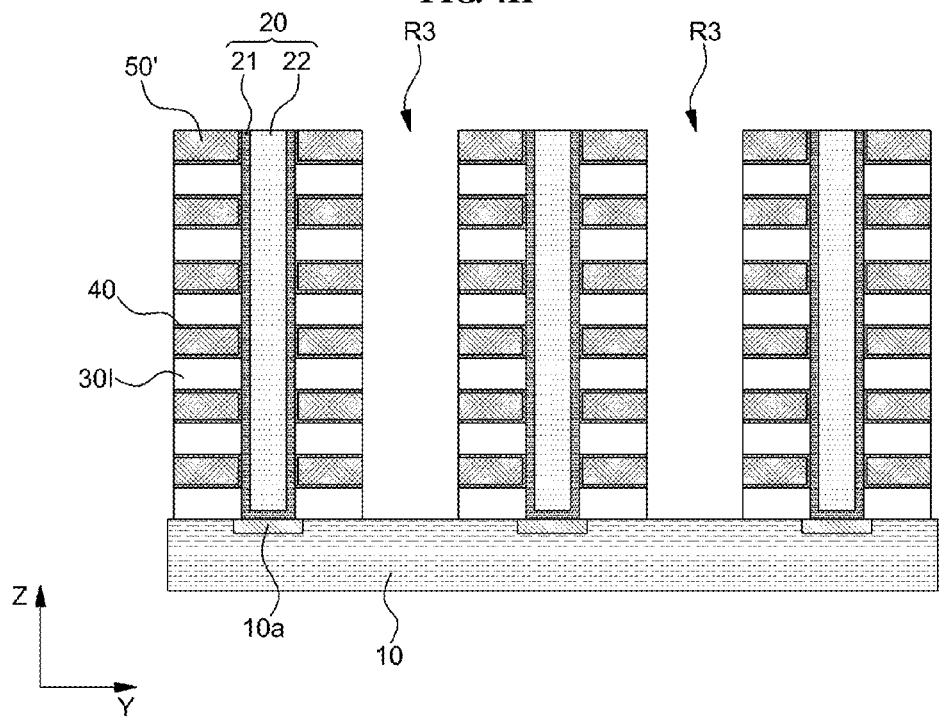
Figure 4L:
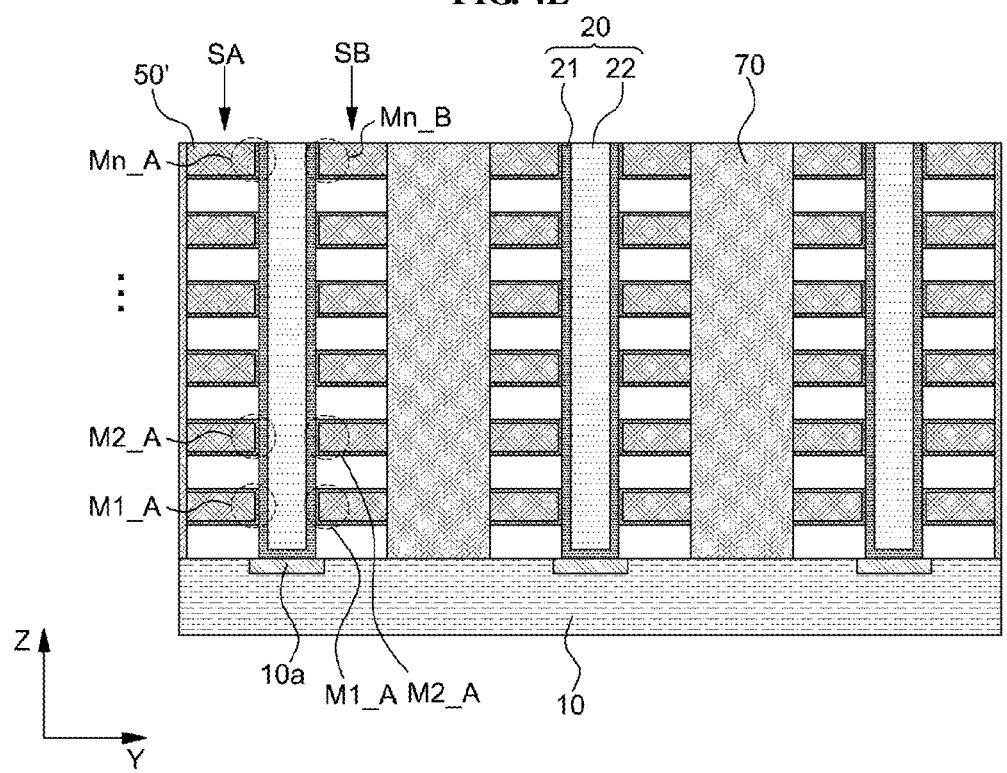
Figure 5K:
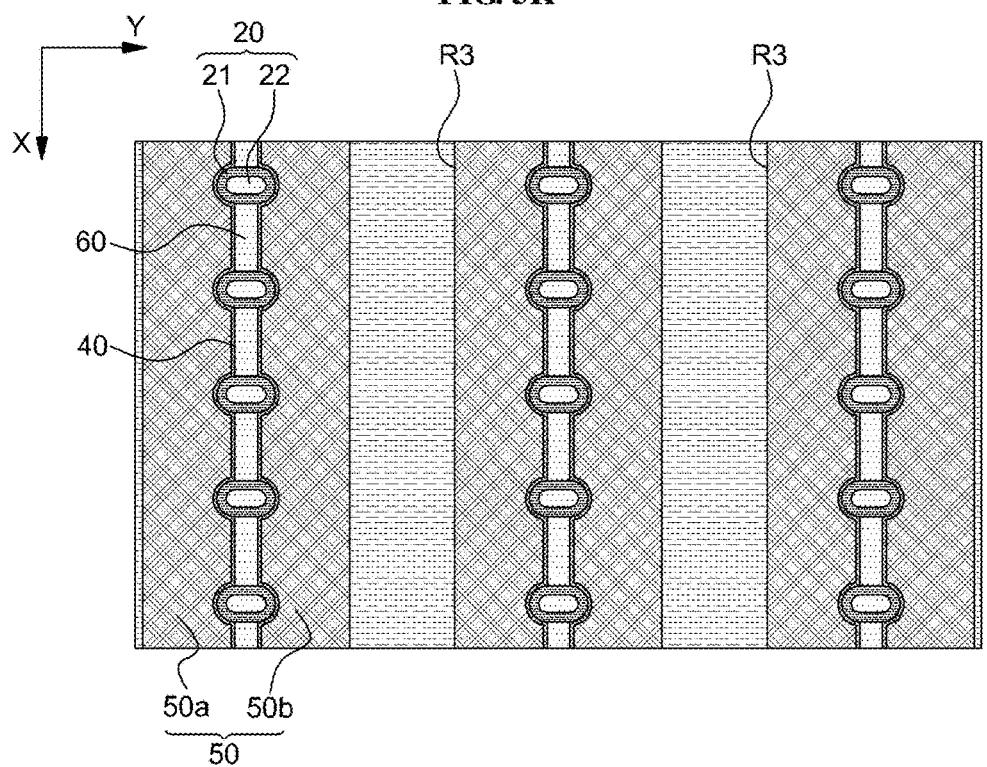
Figure 5L:
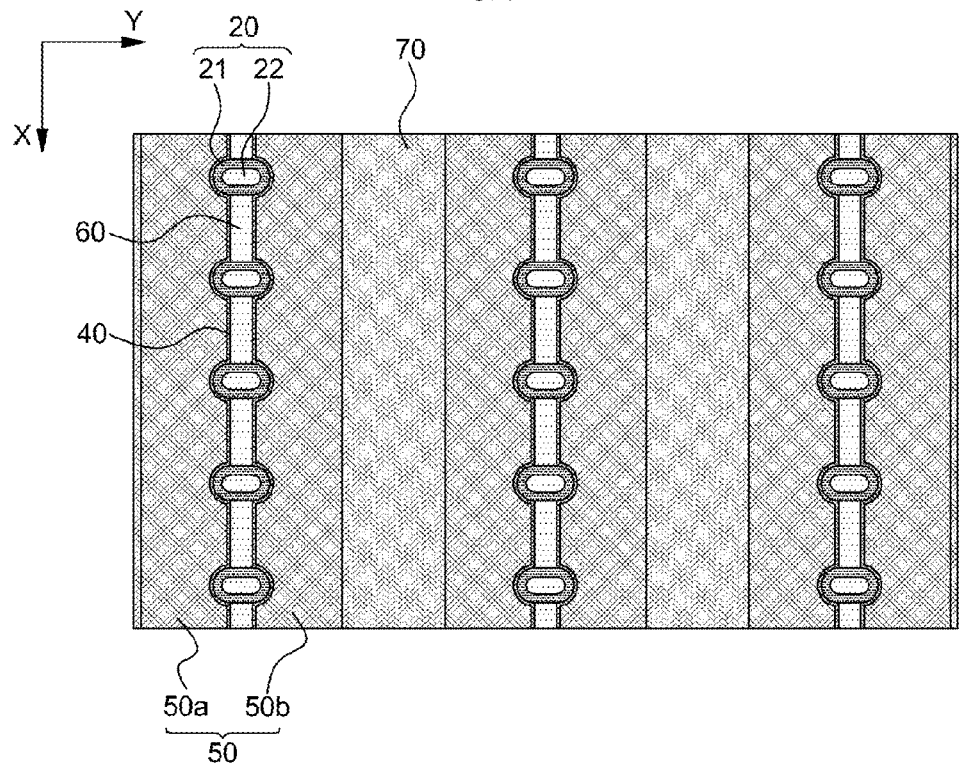

Referring to FIGS. 4K and 5K, a third trench region R3 extending in the first direction (the x-axis direction) and the vertical direction (z-axis direction) may be formed with respect to the substrate 10 on which the conductive film 50' is formed. Next, referring to FIGS. 4L and 5L, memory strings are electrically isolated from one another in the second direction (the y-axis direction) by a device isolation film 70 filling the third trench region R3.

According to the above-described embodiment, the 3-dimensional non-volatile memory device 1000 as shown in FIG. 2A may be provided. The semiconductor pillars 20 arranged in the first direction (the x-axis direction) by the string isolation film 60 may be shared by conductor patterns on both sides, and thus memory capacity may be increased by two times as compared to a gate all round (GAA) structure without the string isolation film 60.

FIGS. 6A through 6F are cross-sectional diagrams sequentially showing a method for fabricating a 3-dimensional nonvolatile memory device according to another embodiment of the present disclosure, and FIGS. 7A through 7F are plan views corresponding to FIG. 6A through 6F, respectively. For the constituent elements of the drawings, the disclosure of the above-mentioned constituent elements having the same reference numerals may be referred to.

Figure 6A:
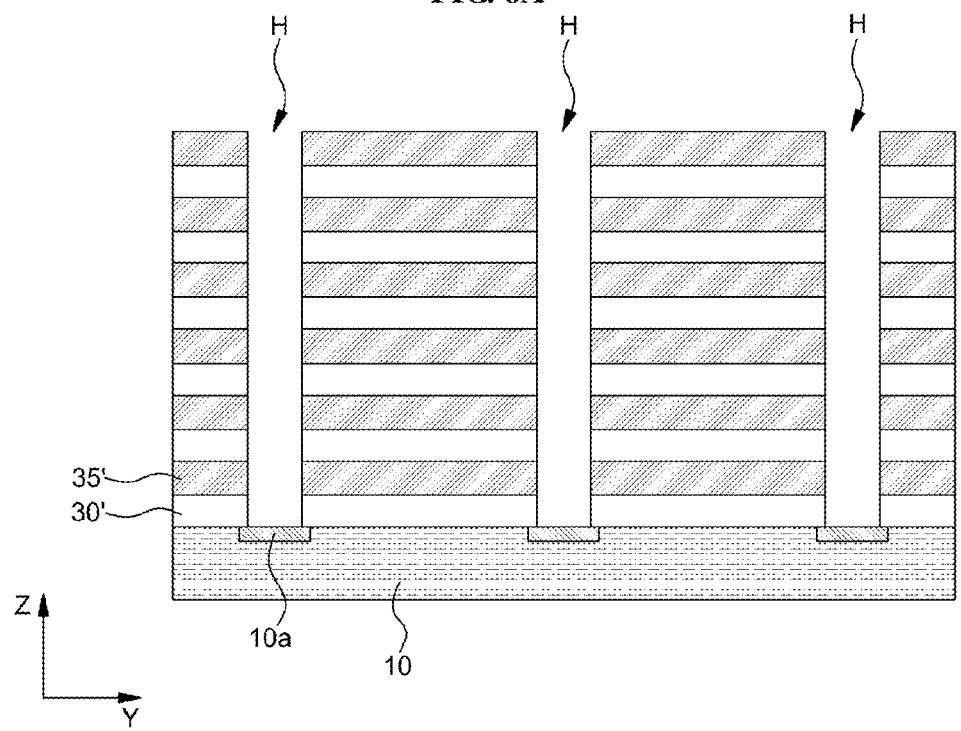
FIGS. 6A through 6F are cross-sectional diagrams sequentially showing a method for fabricating a 3-dimensional nonvolatile memory device according to another embodiment of the present disclosure.
Figure 7A:
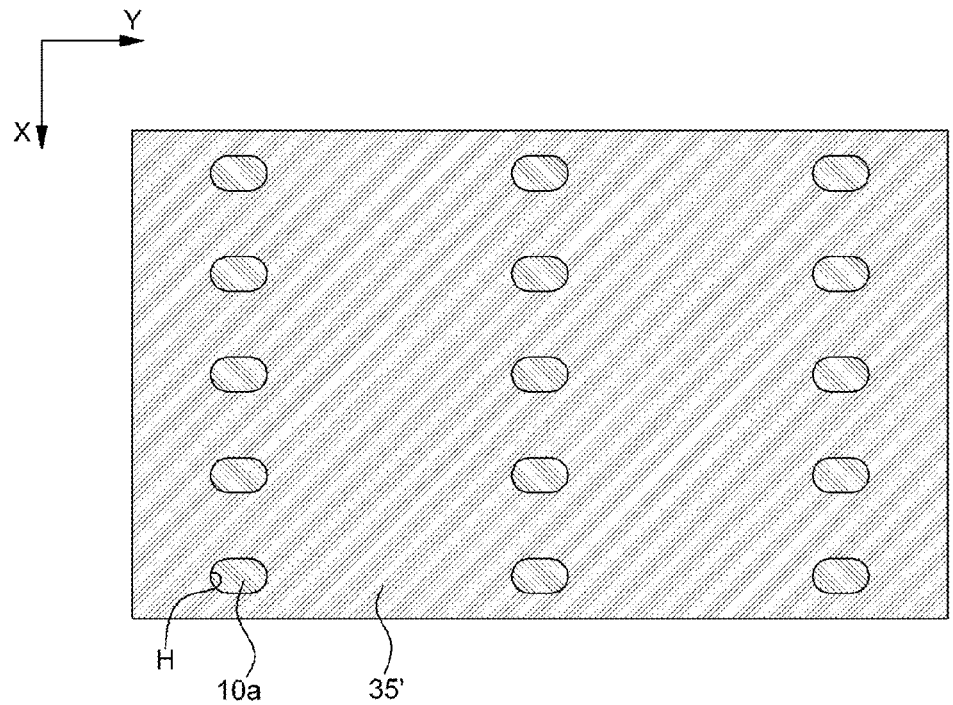
FIGS. 7A through 7F are plan views corresponding to FIG. 6A through 6F, respectively.

Referring to FIGS. 6A and 7A, the insulation films 30' and the sacrificing films 35' may be alternately and repeatedly stacked on the substrate 10. Next, the holes H may be formed in the vertical direction (the z-axis) to penetrate through the stacked structure of the insulation films 30' and the sacrificing films 35'. The cross-sectional shape of the holes H may have a round corner rectangular shape having identical circular arcs on both sides, as described above with reference to FIGS. 3A and 3B.

Figure 6B:
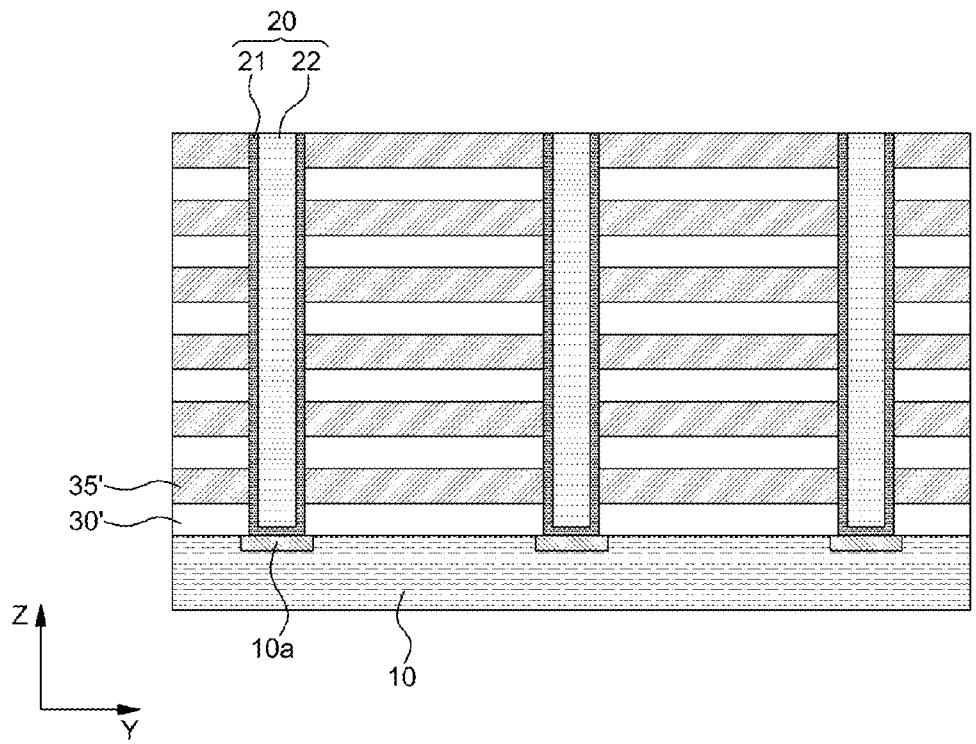
Figure 7B:
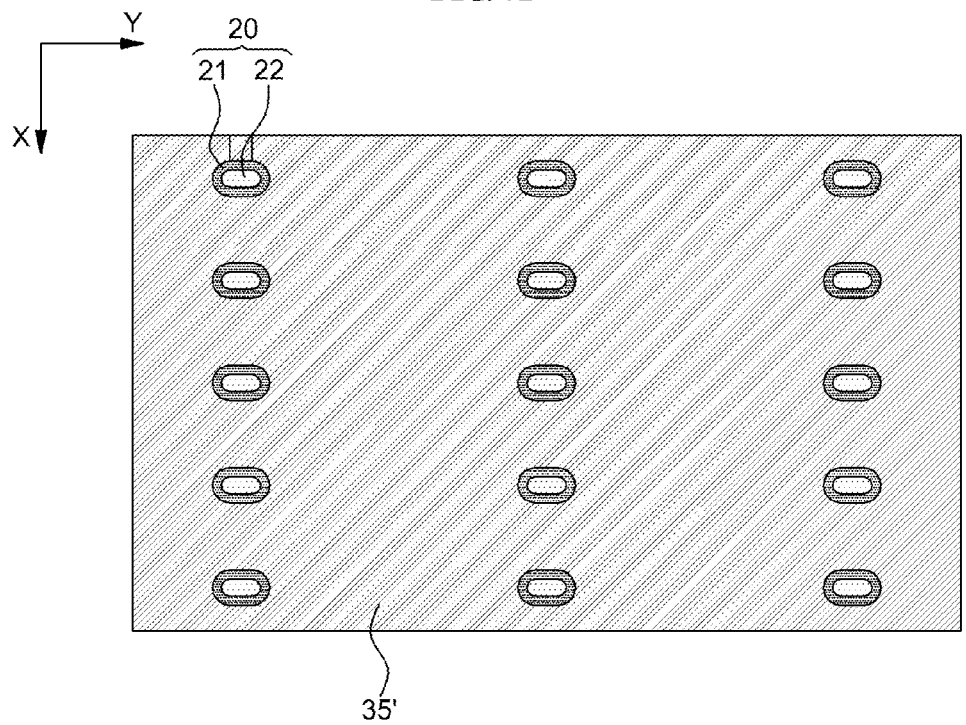

Referring to FIGS. 6B and 7B, the semiconductor pillars 20 may be formed in the holes H, respectively. For example, the semiconductor pillars 20 may be provided by forming the semiconductor layers 21 in the holes H through a thin-film formation process, and successively forming the core insulator 22 filling the holes H on the semiconductor layer 21. The bottom of the semiconductor layer 21 may be formed to contact the substrate 10. For example, the semiconductor layer 21 may be electrically connected to a source line formed in the substrate 10. The semiconductor layer 21 may be polycrystalline or epitaxially-grown monocrystalline. Furthermore, the semiconductor layer 21 may have a stacked structure of at least two or more semiconductor layers, such as a silicon layer/germanium layer structure, but the present disclosure is not limited thereto. The semiconductor layer 21 may be formed through chemical vapor deposition or atomic layer deposition with a high step coverage. The core insulator 22 may be formed of a material having an etch selectivity with the sacrificing film 35'.

Figure 6C:
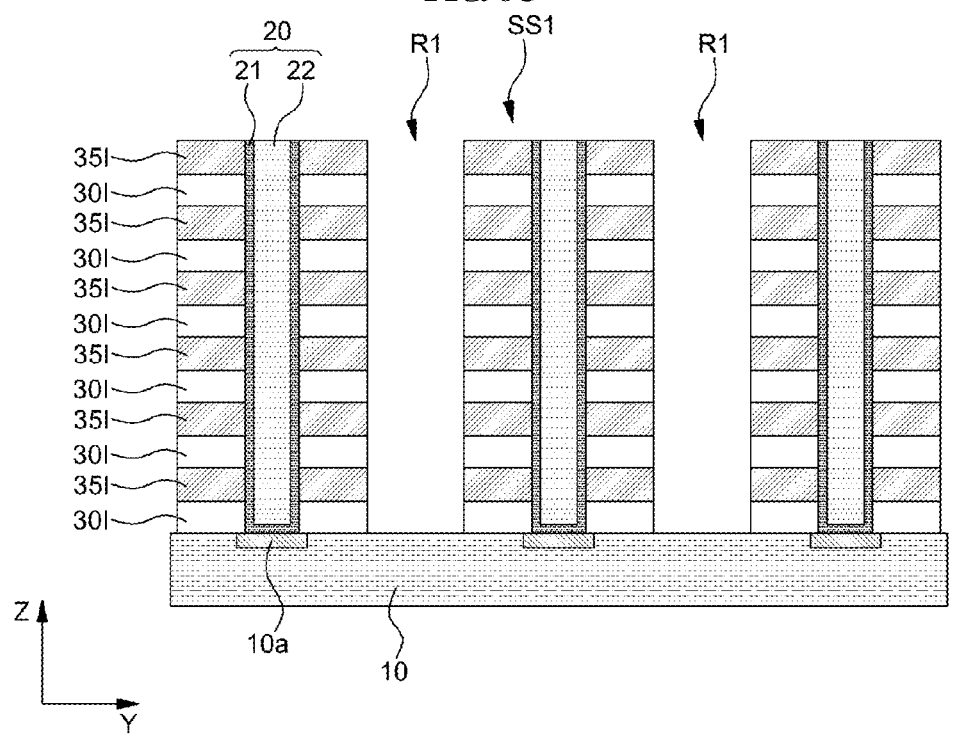
Figure 7C:
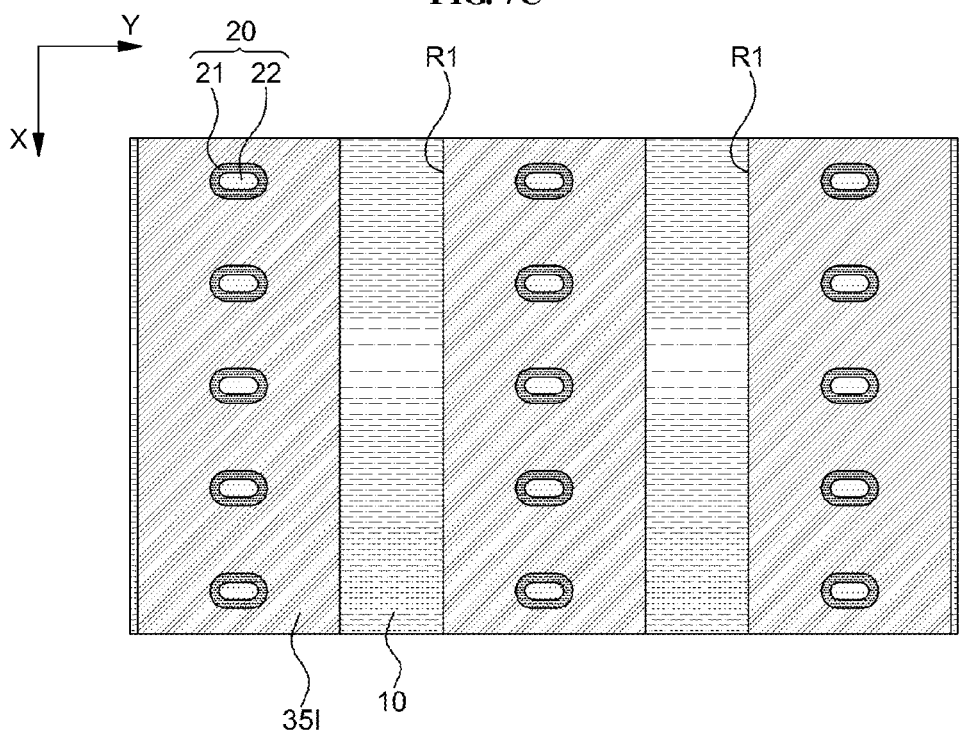

Referring to FIGS. 6C and 7C, the first trench region R1 extending in the first direction (the x-axis direction) and the vertical direction (the z-axis direction) may be formed with respect to the substrate 10 on which the semiconductor pillars 20 have been formed. The aligned semiconductor pillars 20 may be separated by the first trench region R1, and thus the stacked structure SS1 including the insulation film pattern 30I and the sacrificing film pattern 35I may be formed.

Figure 6D:
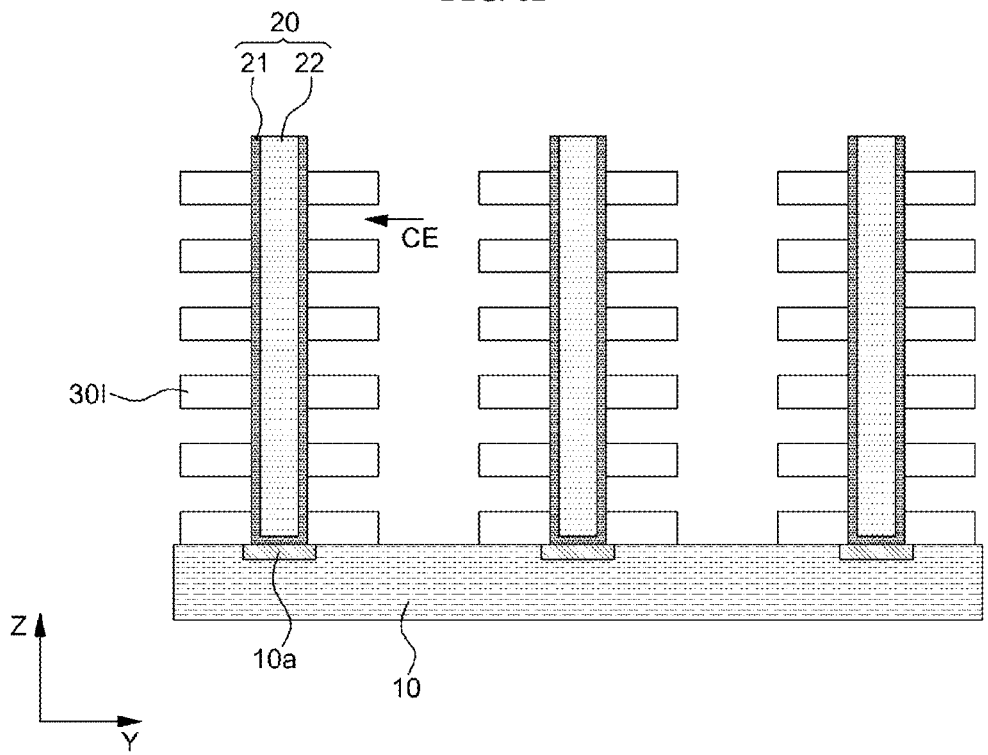
Figure 6E:
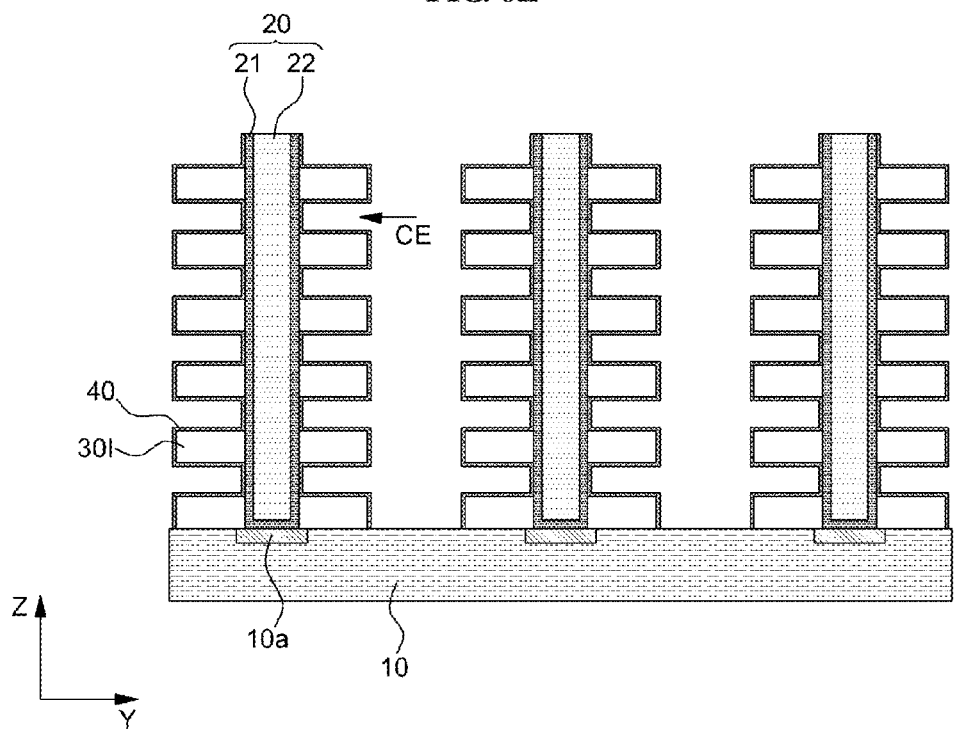
Figure 7D:
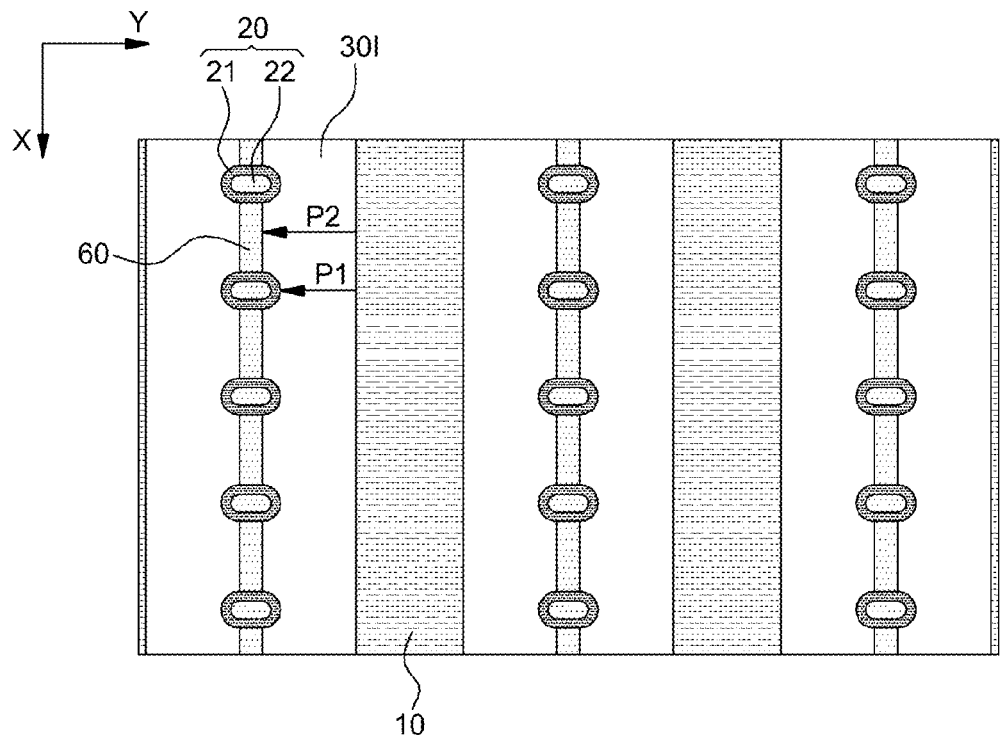
Figure 7E:
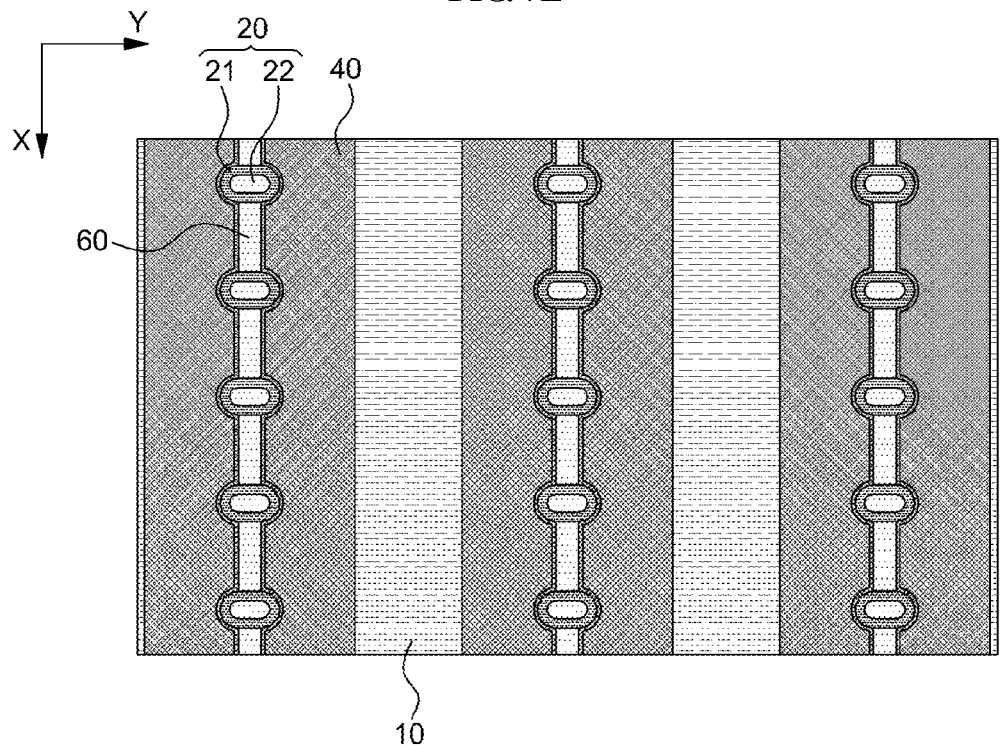

Referring to FIGS. 6D and 7D, the sacrificing film pattern 35I in the stacked structure SS1 exposed through the first trench region R1, may be removed. At this time, only the sacrificing film pattern 35I may be selectively removed through a wet etching by using the etching selectivity between the sacrificing film pattern 35I and the insulation film pattern 30'. The etching of the sacrificing film pattern 35I may be performed, such that a portion 60 of the sacrificing film pattern 35I remains between the semiconductor pillars 20 arranged in the first direction (the x-axis direction). The portion 60 of the sacrificing film pattern 35I may remain, because a width P2 of a region of the sacrificing film pattern 35I between the semiconductor pillars 20 in the second direction (the y-axis direction) is greater than a width P1 of the sacrificing film pattern 35I in a region of the sacrificing film pattern 35I interfaced with the semiconductor pillar 20 in the second direction (the y-axis direction). In other words, when the etching process may be stopped at the point that the etching on the sacrificing film pattern 35I reaches the region interfacing with the semiconductor pillar 20, i.e., the portion 60 of the sacrificing film pattern 35I will remain in the region between the semiconductor pillars 20 arrayed in the x-axis direction, and the remaining portion 60 of sacrificing film pattern 35I may become an insulator between the semiconductor pillars 20 and then may function as a string separating film for separating a stacked structure of insulating film patterns and conductive film patterns. Furthermore, the cell spaces CE are formed around the sidewalls of the semiconductor pillars 20. The feature of the remaining portion Below Referring to FIGS. 6E and 7E, the information storage film 40 may be formed on a substrate 10 having the cell spaces CE formed therein. The information storage film 40 may be formed through a thin-film forming process for securing an excellent step coverage, e.g., a chemical vapor deposition process or an atomic layer deposition process. The information storage film 40 may include the charge storage film 42, such as a floating gate or charge trapping layer which may be insulated by the tunneling insulation film 41 and the blocking insulation film 43, as shown in FIG. 2. However, it is merely an example, and the present disclosure is not limited thereto.

Figure 6F:
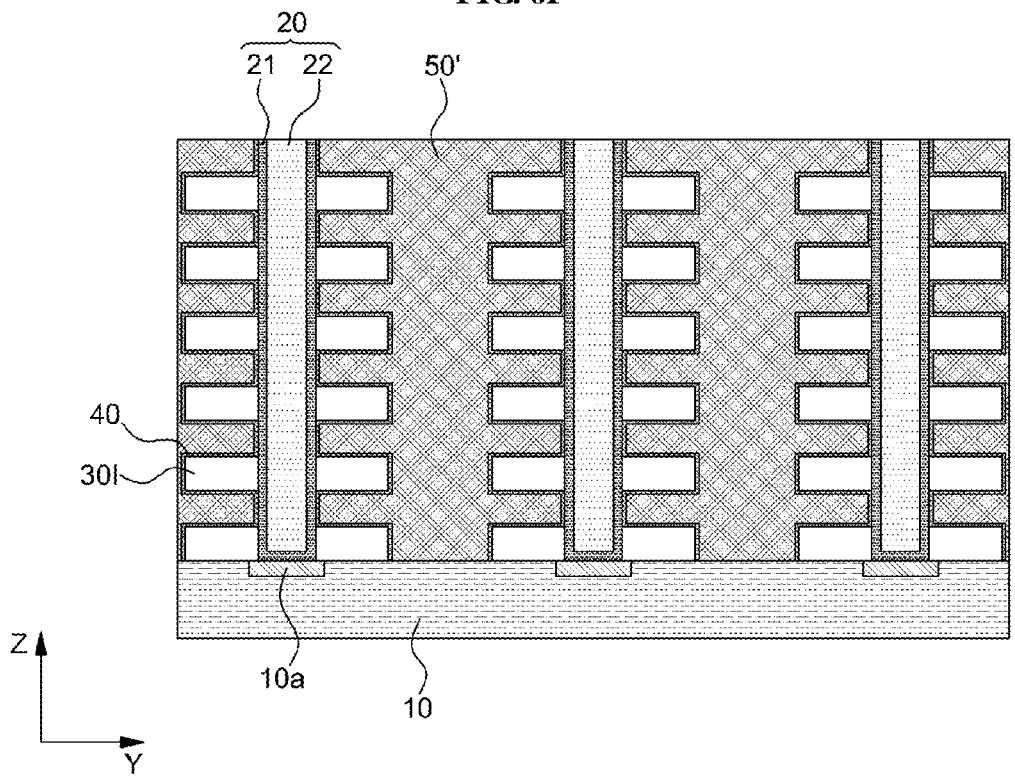
Figure 7F:
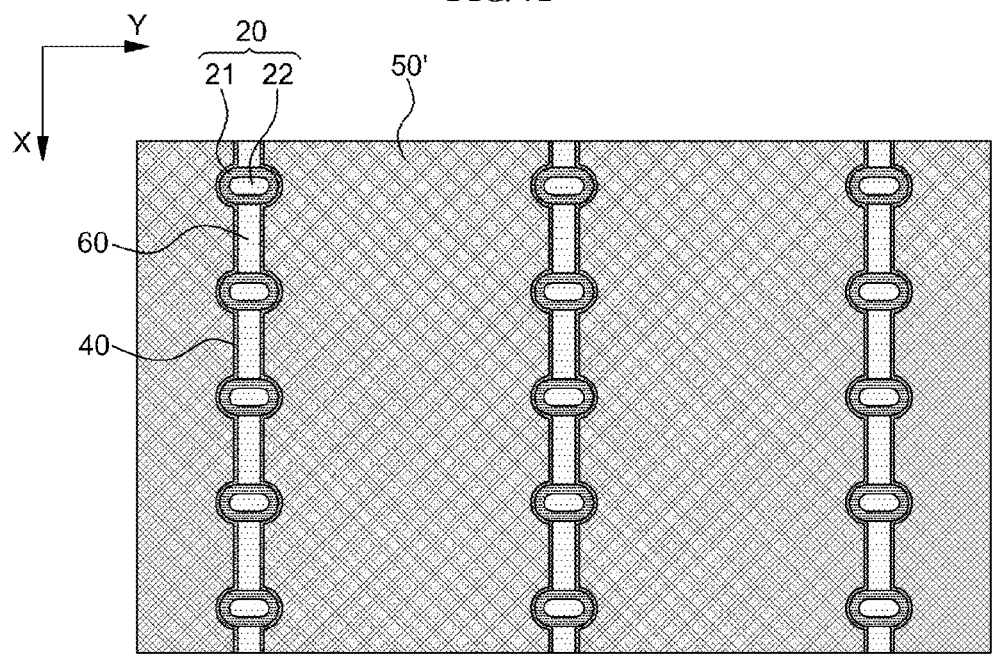

Referring to FIGS. 6F and 7F, the conductive film 50' filling at least some of the cell spaces CE having the information storage film 40 already formed therein, is formed. The conductive film 50' may include a single conductive film, such as a titanium nitride (TiN) film, or a stacked structure including two or more films, such as a titanium nitride film (TiN) and/or a tungsten (W) film. Furthermore, the second trench region R2 extending in the first direction (x-axis direction) and the vertical direction (z-axis direction) may be formed with respect to the substrate 10 on which the conductive film 50' is been already formed (refer to the third trench region R3 of FIGS. 4J and 5J). Next, memory strings are electrically isolated from one another in the second direction (the y-axis direction) by a device isolation film (70 of FIGS. 4K and 5K) filling the second trench region R2.

According to the above-described embodiment, a 3-dimensional non-volatile memory device 1000 as shown in FIG. 2A may be provided. The semiconductor pillars 20 arranged in the first direction (the x-axis direction) by the string isolation film 60 are shared by conductor patterns on both sides, and thus memory capacity may be increased by two times as compared to a gate all round architecture (GAA) deficient in the string isolation film 60 of the present disclosure.

Figure 8:
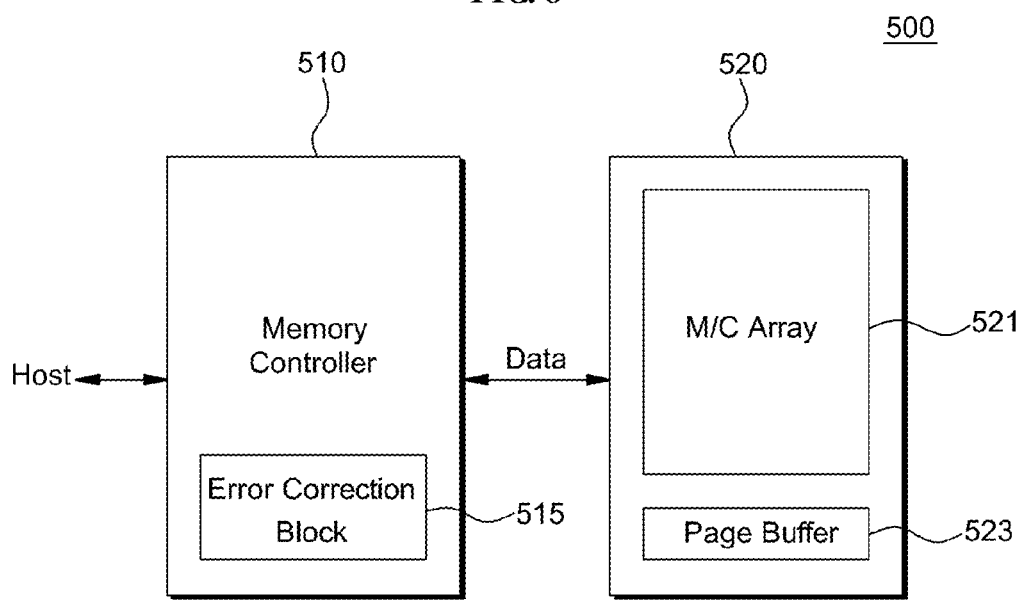
FIG. 8 is a block diagram showing a memory system in accordance with an embodiment of the present disclosure.

FIG. 8 is a block diagram showing a memory system 500 in accordance with an embodiment.

Referring to FIG. 8, the memory system 500 includes a memory controller 510 and a non-volatile memory device 520. The memory controller 510 may perform error correcting codes with respect to the non-volatile memory device 520. The memory controller 510 may control the non-volatile memory device 520 based on commands and addresses from an external circuit.

The memory controller 510 may perform an error correcting encoding process on a data requested to write, when the memory controller 510 receives a write request from a host. Furthermore, the memory controller 510 may control the non-volatile memory device 520 to program the encoded data at a memory region corresponding to a provided address. Furthermore, during a read operation, the memory controller 510 may perform an error correcting decoding process on a data output from the non-volatile memory device 520. Errors included in output data may be corrected by the error correcting decoding process. To detect and correct the errors, the memory controller 510 may include an error correction block 515.

The non-volatile memory device 520 may include a memory cell array 521 and a page buffer 523. The memory cell array 521 may include an array of single-level memory cells or 2 or higher bit multi-level memory cells. When the memory controller 510 receives an initialization request, the memory controller 510 may initialize string selection transistors of respective memory layers to have a predetermined state (threshold voltage) by using a programming technique or an erasing technique using time varying erase voltage signals FIG. 9 is a block diagram showing a storage device 1000 including a SSD according to an embodiment.

Figure 9:
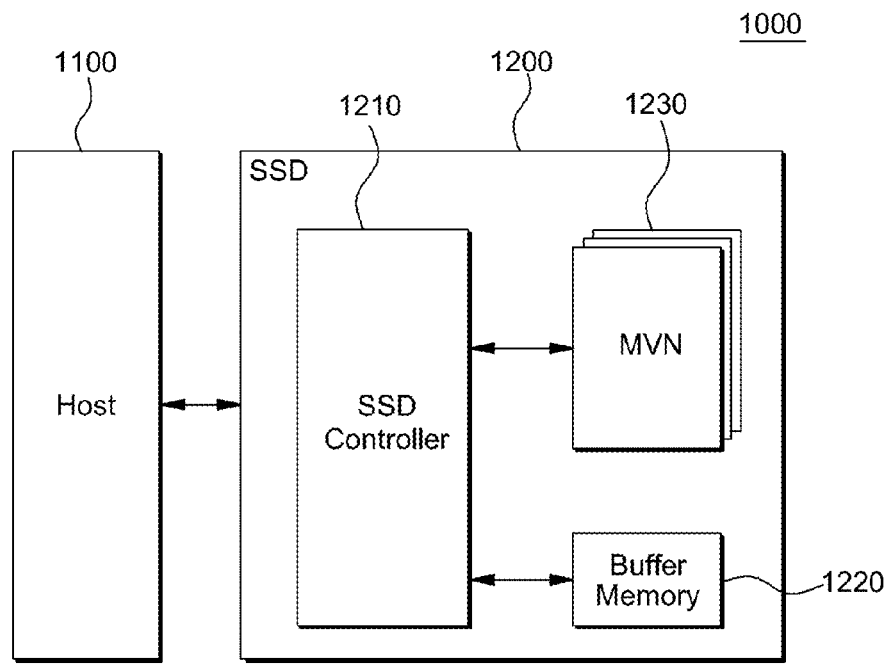
FIG. 9 is a block diagram showing a storage device including a SSD in accordance with an embodiment of present disclosure.

Referring to FIG. 9, the storage device 1000 may include a host 1100 and a SSD 1200. The SSD 1200 may include a SSD controller 1210, a buffer memory 1220, and a non-volatile memory device 1230. The SSD controller 1210 provides electric and physical connections between the host 1100 and the SSD 1200. According to an embodiment, the SSD controller 1210 provides an interface between the host 1100 and the SSD 1200 in correspondence to a bus format of the host 1100. Furthermore, the SSD controller 1210 may decode commands provided by the host 1100 and access the non-volatile memory device 1230 based on a result of the decoding. Unlimited examples of the bus format of the host 1100 may include a USB (Universal Serial Bus), a SCSI (Small Computer System Interface), a PCI express, an ATA (Advanced Technology Attachment), a PATA (Parallel ATA), a SATA (Serial ATA), and a SAS (Serial Attached SCSI).

A data to be written provided by the host 1100 or a data read out from the non-volatile memory device 1230 may be temporarily stored in the buffer memory 1220. When the host 1100 sends a read request and data existing in the non-volatile memory device 1230 is cached, the buffer memory 1220 may provide a cache function for providing cached data directly to the host 1100. Generally, data transmission rate based on a bus format (e.g., SATA or SAS) of the host 1100 may be faster than data transmission speed of memory channels of the SSD 1200. In this case, the large-capacity buffer memory 1220 may be provided to minimize performance deterioration due to the speed difference. The buffer memory 1220 therefor may be a synchronous DRAM for providing sufficient buffering performance. However, the present disclosure is not limited thereto.

The non-volatile memory device 1230 may be provided as a storage medium of the SSD 1200. For example, the non-volatile memory device 1230 may be a NAND-type flash memory with large storage capacity. For another example, a NOR-type flash memory, a phase-change memory, a magnetic memory, a resistive memory, a ferro-dielectric memory, or a memory system including a combination thereof may be applied as the non-volatile memory device 1230.

Figure 10:
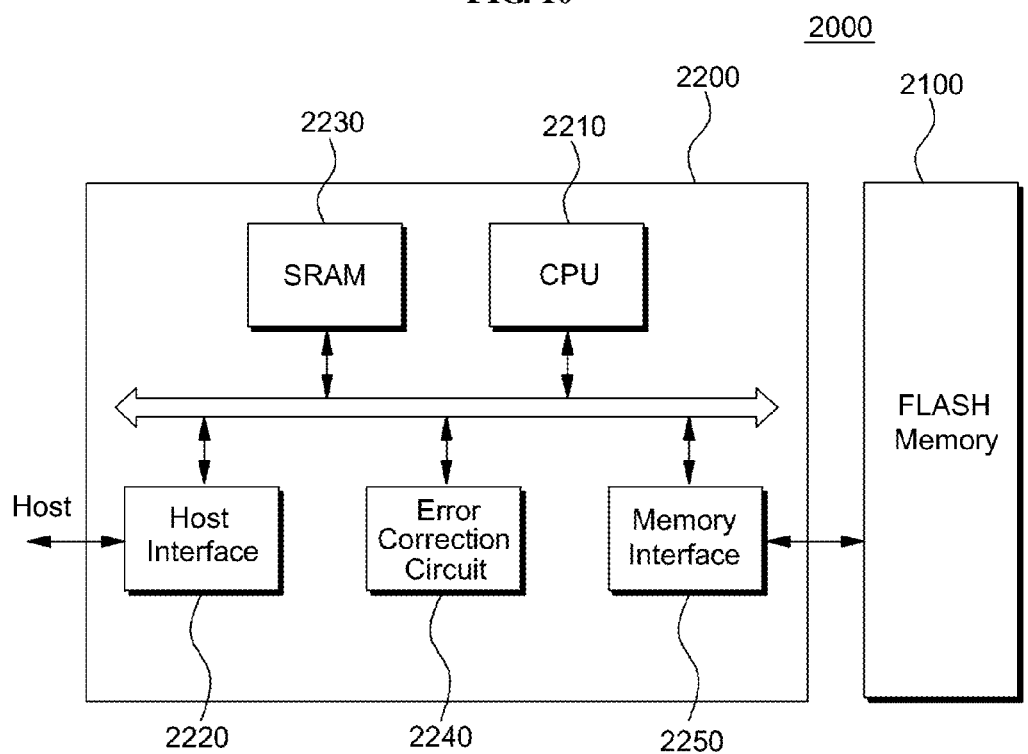
FIG. 10 is a block diagram showing a memory system in accordance with another embodiment of the present disclosure.

FIG. 10 is a block diagram showing a memory system 2000 according to another embodiment.

Referring to FIG. 10, the memory system 2000 may include a memory controller 2200 and a flash memory device 2100. The flash memory device 2100 may include the non-volatile memory devices 100, 200, and 300 as described above with reference to FIGS. 1 through 7. The flash memory device 2100 may exhibit high-speed and reliable program performance.

The memory controller 2200 may be configured to control the flash memory device 2100. An SRAM 2230 may be used as an operation memory for the CPU 2210. A host interface 2220 may embody a data exchange protocol for the host to be connected to the memory system 2000. An error correction circuit 2240 equipped in the memory controller 2200 may detect and correct errors included in data read out from the flash memory device 2100. A memory interface 2250 may perform interfacing with the flash memory device 2100. A CPU 2210 may perform overall control operations for data exchange of the memory controller 2200. The memory system 2000 in accordance with the present disclosure may further include a ROM (not shown) that stores code data for interfacing with a host.

The flash memory device 2100 may be configured to communicate with an external circuit (e.g., a host) via one of various interface protocols, such as USB, MMC, PCI-E, SAS, SATA, PATA, SCSI, ESDI, or IDE. The memory system 2000 in accordance with the present disclosure may be applied to various user devices, such as a ultra-mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device capable of transmitting and receiving data wirelessly, or a home network.

Figure 11:
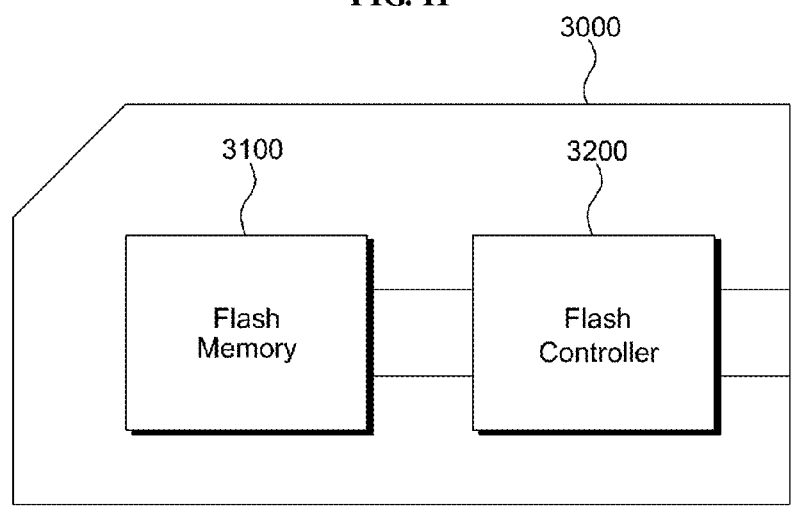
FIG. 11 is a block diagram showing a data storage device in accordance with another embodiment of the present disclosure.

FIG. 11 is a block diagram showing a data storage device 3000 according to another embodiment.

Referring to FIG. 11, the data storage device 3000 may include a flash memory 3100 and a flash controller 3200. The flash controller 3200 may control the flash memory 3100 based on control signals received from an external circuit connected to the data storage device 3000. A 3D memory array structure of the flash memory 3100 may be a channel stacked structure, a straight-shaped bit cost scalable structure, or a pipe-shaped BiCs structure. However, the above-stated structures are merely examples, and the present disclosure is not limited thereto.

The data storage device 3000 in accordance with the present disclosure may constitute a memory card device, a SSD device, a multimedia card device, a SD card, a memory stick device, a hard disk drive device, a hybrid drive device, or a USB flash device. For example, the data storage device 3000 in accordance with the present disclosure may be a memory card that satisfies a standard or a specification to be generally used in an electronic device, such as a digital camera or a personal computer.

Figure 12:
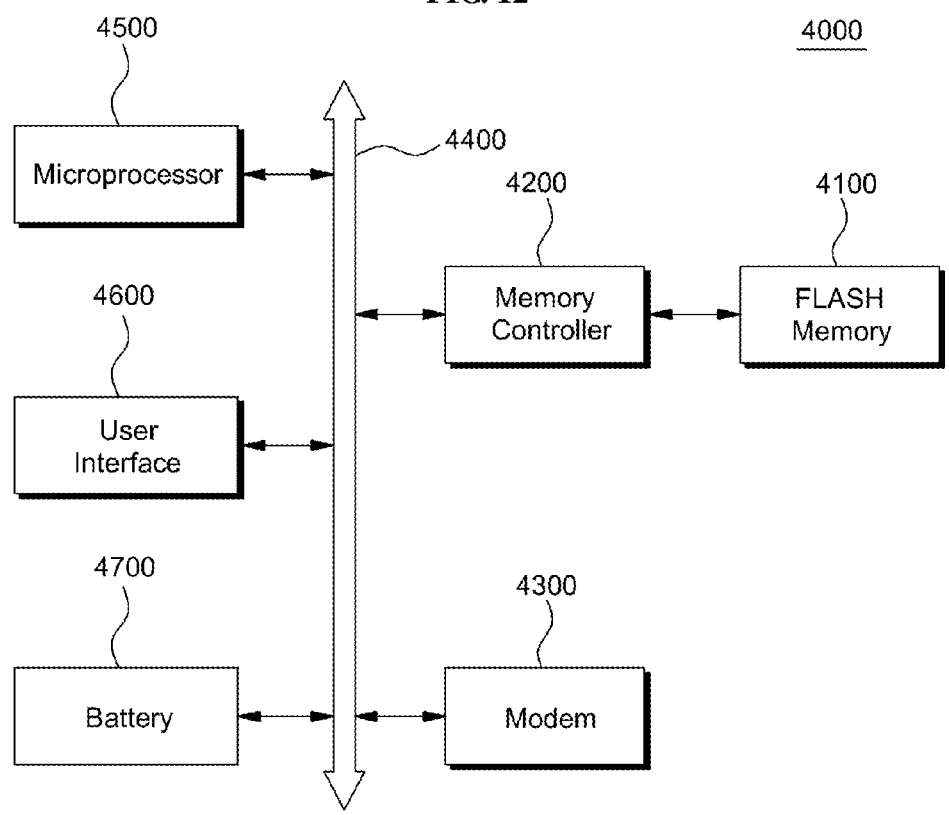
FIG. 12 is a block diagram showing a nonvolatile memory device and a computing system including the memory device in accordance with an embodiment of the present disclosure.

FIG. 12 is a block diagram showing a flash memory device 4100 and a computing system 4000 including the flash memory device 4100 in accordance with an embodiment of the present disclosure.

Referring to FIG. 12, the computing system 4000 in accordance with the present disclosure may include the flash memory device 4100, a memory controller 4200, a modem 4300, such as a baseband chipset, a microprocessor 4500, and a user interface 4600 that are electrically connected to a bus 4400.

The flash memory device 4100 shown in FIG. 12 may be a non-volatile memory device as described above. The computing system 4000 in accordance with the present disclosure may be a mobile device. In this case, the computing system 4000 may further include a battery 4700 for supplying a power for operating the computing system 4000. Although not shown, the computing system 4000 in accordance with the present disclosure may further include an application chipset, a camera image processor (CIS), or a mobile DRAM. The memory controller 4200 and the flash memory device 4100 may constitute a SSD using a non-volatile memory device for storing data.

A non-volatile memory device and/or a memory controller in accordance with the present disclosure may be mounted via various-types of packages. For example, a non-volatile memory device and/or a memory controller may be mounted via any of various packages including PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi-Chip Package (MCP), Wafer-level Fabricated Package (WFP), or Wafer-Level Processed Stack Package (WSP).

According to an embodiment of the present disclosure, there is provided a 3-dimensional non-volatile memory device in which semiconductor pillars arranged in a first direction by a string isolation film are shared by two electrically separated sub-lines, thus having increased data storage capacity as compared to a gate all-round (GAA) structure without a string isolation film.

According to another embodiment of the present disclosure, there is provided a method of manufacturing a 3-dimensional nonvolatile memory device having the above-stated advantages by forming a string isolation film therein without adding a complicated process.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A 3-dimensional non-volatile memory device comprising:
   a substrate;
   semiconductor pillars, which are arranged at a certain interval in a first direction and a second direction different from the first direction, and both of the first direction and the second direction are parallel to a main surface of the substrate;
   a string isolation film, which is arranged between the semiconductor pillars arranged in the first direction among the semiconductor pillars and extends in the first direction and a third direction vertical to the main surface of the substrate;
   first sub-electrodes repeatedly stacked on the substrate in the third direction;

second sub-electrodes, which are electrically isolated from the first sub-electrodes by the string isolation film, and are repeatedly stacked on the substrate in the third direction; and information storage films including a first information storage film and a second information storage film, the first information film being disposed between the first sub-electrodes and the semiconductor pillars arranged in the first direction, and the second information storage film disposed between the second sub-electrodes and the semiconductor pillars being arranged in the first direction, wherein first memory strings are provided by a first information storage film and the first sub-electrodes, wherein second memory strings are provided by a second information storage film and the second sub-electrodes, wherein the first memory string and the second memory string share the semiconductor pillars arranged in the first direction, wherein the information storage film comprises a tunneling insulation film on the semiconductor pillar, a charge storage layer on the tunneling insulation film, and a blocking insulation film on the charge storage layer, wherein the tunneling insulating film is isolated into each cell in a vertical direction along a sidewall of the semiconductor pillars and surrounds the charge storage layer, the blocking insulating film and the sub-electrode, wherein the information storage film extends onto a sidewall of the string isolation film.

2. The 3-dimensional non-volatile memory device of claim 1, wherein the string isolation film has a plate-type structure having a constant thickness.

3. The 3-dimensional non-volatile memory device of claim 1, further comprising:

an interlayer insulation film repeatedly stacked on the substrate with the information storage films in a vertical direction; and a device isolation film for electrically isolating the sub-electrodes disposed between the semiconductor pillars arranged in the second direction, wherein the tunneling insulating film is continuously disposed on an upper and a lower surfaces of the interlayer insulation film as well as channel regions of the semiconductor pillars exposed between the interlayer insulating films.

4. The 3-dimensional non-volatile memory device of claim 3, wherein an insulation layer pattern is inserted between the first sub-electrodes and the second sub-electrode, and the insulation layer pattern and the string isolation film are formed of a same material.

5. The 3-dimensional non-volatile memory device of claim 3, wherein an insulation layer pattern is inserted between the first sub-electrodes and the second sub-electrode, and the insulation layer pattern and the string isolation film are formed of different materials having etch selectivity.

6. The 3-dimensional non-volatile memory device of claim 1, wherein contact surfaces of the semiconductor pillar against the first sub-electrode and the second sub-electrode have circular arc cross-sections.

7. The 3-dimensional non-volatile memory device of claim 1, wherein the circular arc cross-sections have semicircular shapes.

8. The 3-dimensional non-volatile memory device of claim 6, wherein the centers of the circular arc cross-sections have a distance greater than the thickness of the string isolation film.

9. The 3-dimensional non-volatile memory device of claim 1, wherein the semiconductor pillar comprises:

a core insulator extending in the vertical direction; and a semiconductor layer formed on the core insulator.

10. The 3-dimensional non-volatile memory device of claim 1, wherein the semiconductor layer comprises polysilicon, and thickness of the semiconductor layer is from about 8 nm to about 12 nm.

11. The 3-dimensional non-volatile memory device of claim 1, wherein the semiconductor pillar has a straight-shaped bit cost scalable structure (BiCs), a pipe-shaped BiCs structure, or a combination thereof.

12. The 3-dimensional non-volatile memory device of claim 1, wherein the memory strings constitute a NAND-type flash memory device.

13. A 3-dimensional non-volatile memory device comprising:

a substrate;

semiconductor pillars, which are arranged at a certain interval in a first direction and a second direction different from the first direction, and both of the first direction and the second direction are parallel to a main surface of the substrate;

a string isolation film, which is arranged between the semiconductor pillars arranged in the first direction among the semiconductor pillars and extends in the first direction and a third direction vertical to the main surface of the substrate;

first sub-electrodes repeatedly stacked on the substrate in the third direction;

second sub-electrodes, which are electrically isolated from the first sub-electrodes by the string isolation film, and are repeatedly stacked on the substrate in the third direction; and information storage films including a first information storage film and a second information storage film, wherein first memory strings are provided by a first information storage film and the first sub-electrodes, wherein second memory strings are provided by a second information storage film and the second sub-electrodes, wherein the first memory string and the second memory string share the semiconductor pillars arranged in the first direction, wherein the information storage film comprises a tunneling insulation film on the semiconductor pillar, a charge storage layer on the tunneling insulation film, and a blocking insulation film on the charge storage layer, wherein the tunneling insulating layer is isolated into each cell in a vertical direction along a sidewall of the semiconductor pillars and surrounds the charge storage layer, the blocking insulating film and the sub-electrode, wherein the information storage film extends onto a sidewall of the string isolation film.

14. The 3-dimensional non-volatile memory device of claim 13, wherein the string isolation film has a plate-type structure having a constant thickness.

15. The 3-dimensional non-volatile memory device of claim 13, wherein contact surfaces of the semiconductor pillar against the first sub-electrode and the second sub-electrode have circular arc cross-sections.

16. The 3-dimensional non-volatile memory device of claim 13, wherein the circular arc cross-sections have semicircular shapes.

17. The 3-dimensional non-volatile memory device of claim 15, wherein the centers of the circular arc cross-sections have a distance greater than the thickness of the string isolation film.

* * * * *